United States Patent
Seto et al.

(10) Patent No.: US 7,980,679 B2
(45) Date of Patent: Jul. 19, 2011

(54) PIEZOELECTRIC ELEMENT, LIQUID DROPLET EJECTING HEAD, IMAGE FORMING DEVICE, AND METHOD OF MANUFACTURING LIQUID DROPLET EJECTING HEAD

(75) Inventors: Shinji Seto, Kanagawa (JP); Hirofumi Nakamura, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1084 days.

(21) Appl. No.: 11/807,616

(22) Filed: May 30, 2007

(65) Prior Publication Data

US 2008/0143794 A1    Jun. 19, 2008

(30) Foreign Application Priority Data

Dec. 15, 2006    (JP) ................................. 2006-338332

(51) Int. Cl.
*B41J 2/045* (2006.01)

(52) U.S. Cl. ........................................................ 347/68
(58) Field of Classification Search ................... 347/68, 347/69, 70–72; 400/124.14, 124.16; 310/311, 310/324, 327
See application file for complete search history.

(56) References Cited

FOREIGN PATENT DOCUMENTS

| JP | 2002-234158 | 8/2002 |
| JP | 2006-006096 | 1/2006 |
| JP | 2006-188427 | 7/2006 |
| WO | 2005/031886 | 4/2005 |

*Primary Examiner* — K. Feggins
(74) *Attorney, Agent, or Firm* — Fildes & Outland, P.C.

(57) ABSTRACT

A piezoelectric element includes: a lower electrode which is formed on a surface of a vibrating plate, and is one polarity of a piezoelectric element which displaces the vibrating plate; a flexurally-deformable piezoelectric body formed on a surface of the lower electrode; and an upper electrode which is formed on a surface of the piezoelectric body, and is another polarity of the piezoelectric element. The piezoelectric body is formed by a vacuum deposition method. Polarization of the piezoelectric body is oriented in a direction from the lower electrode toward the upper electrode.

21 Claims, 24 Drawing Sheets

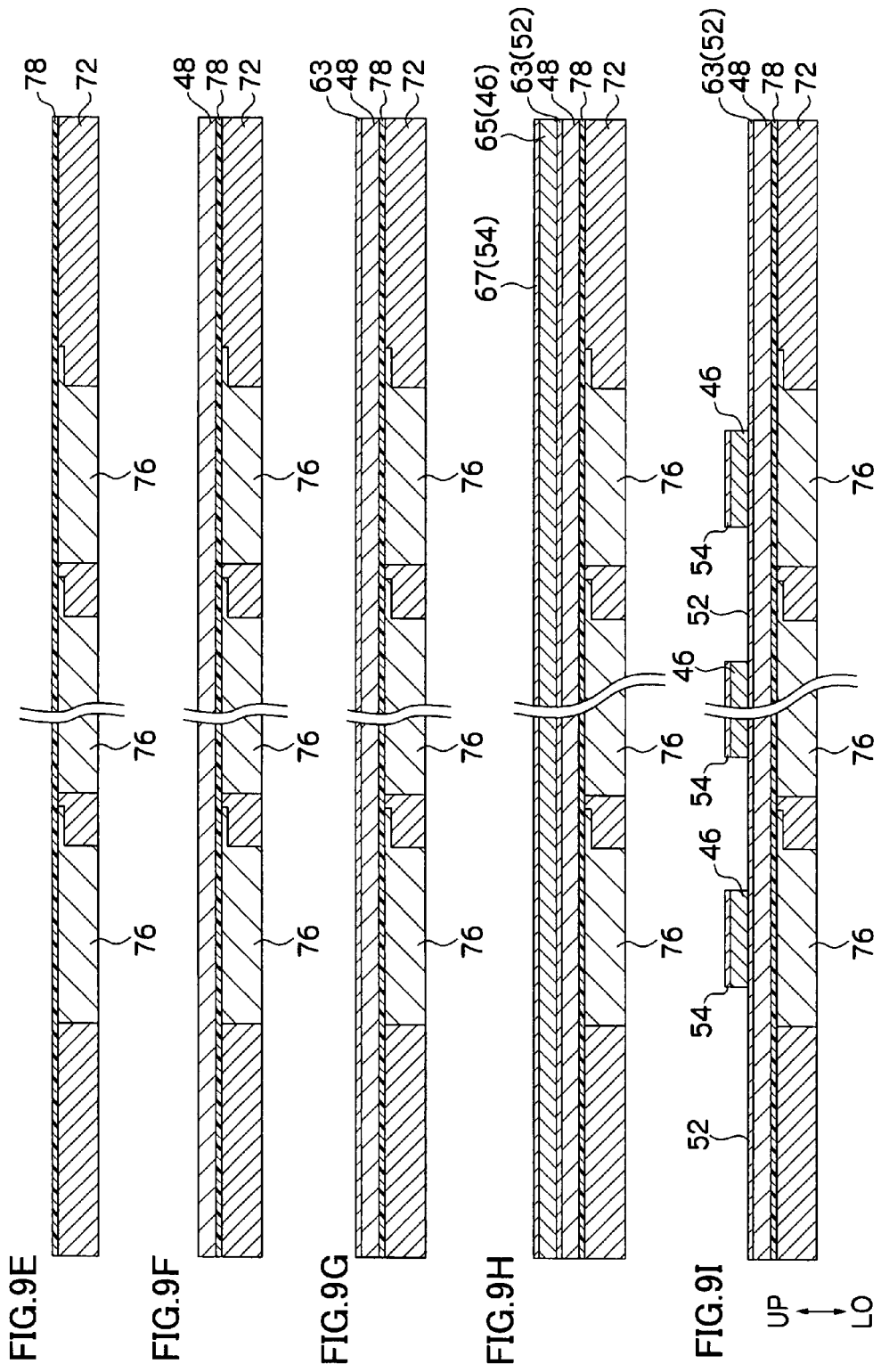

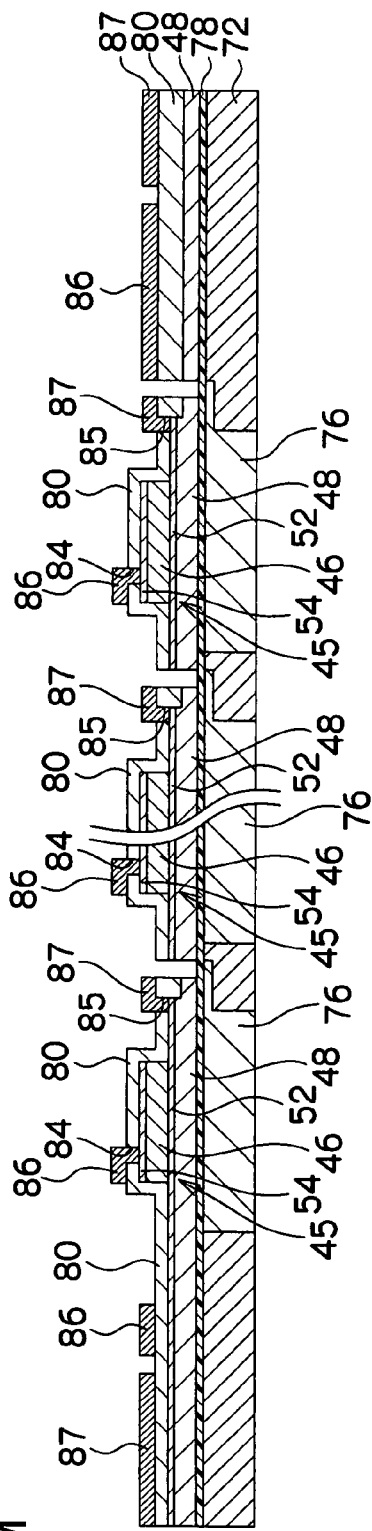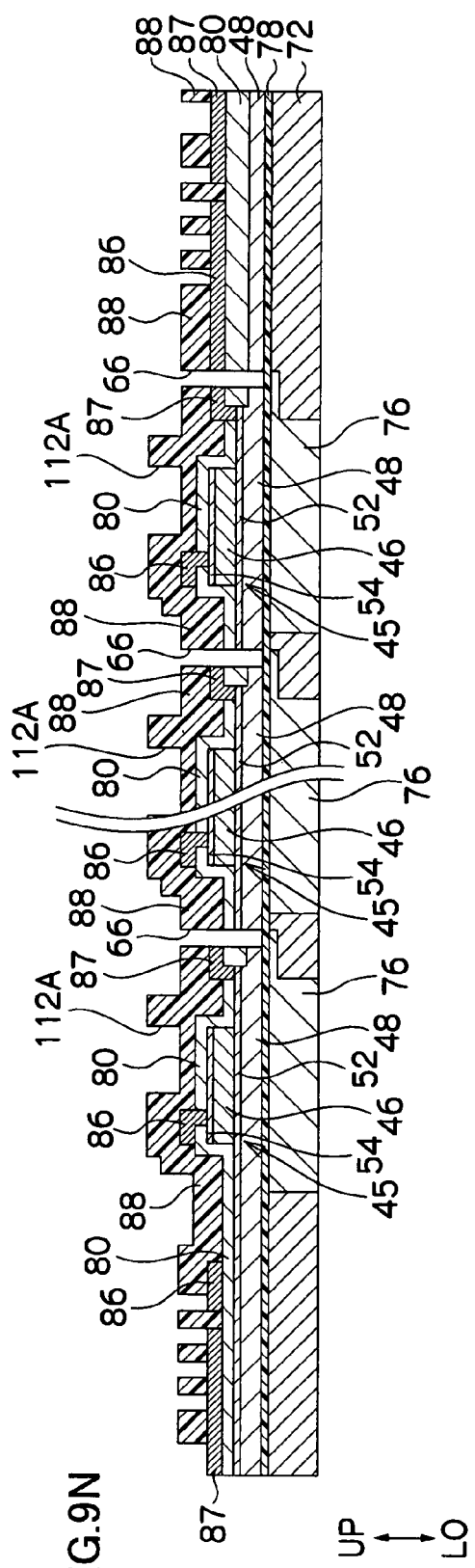

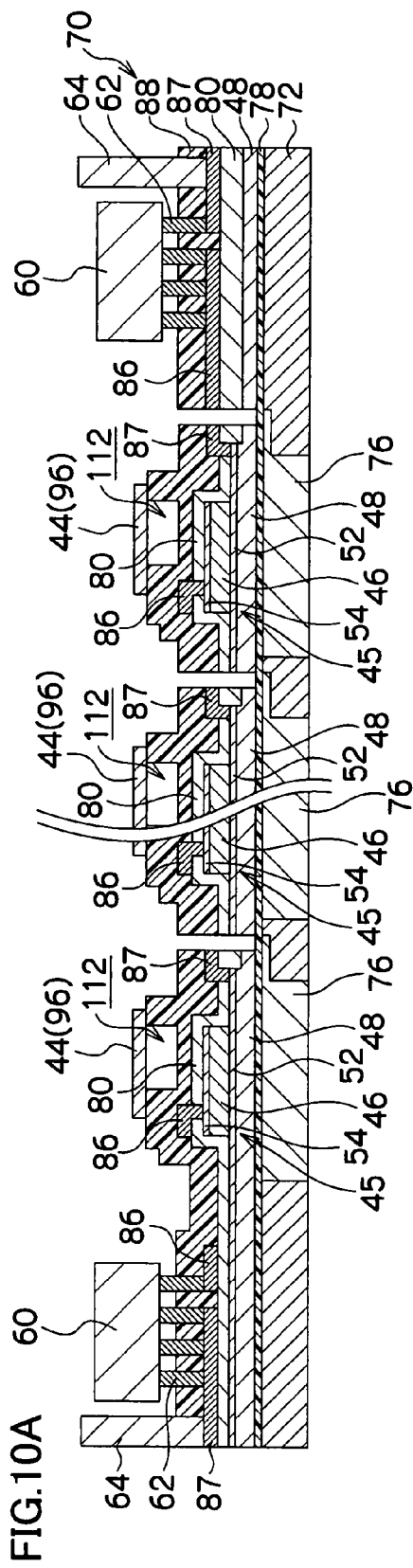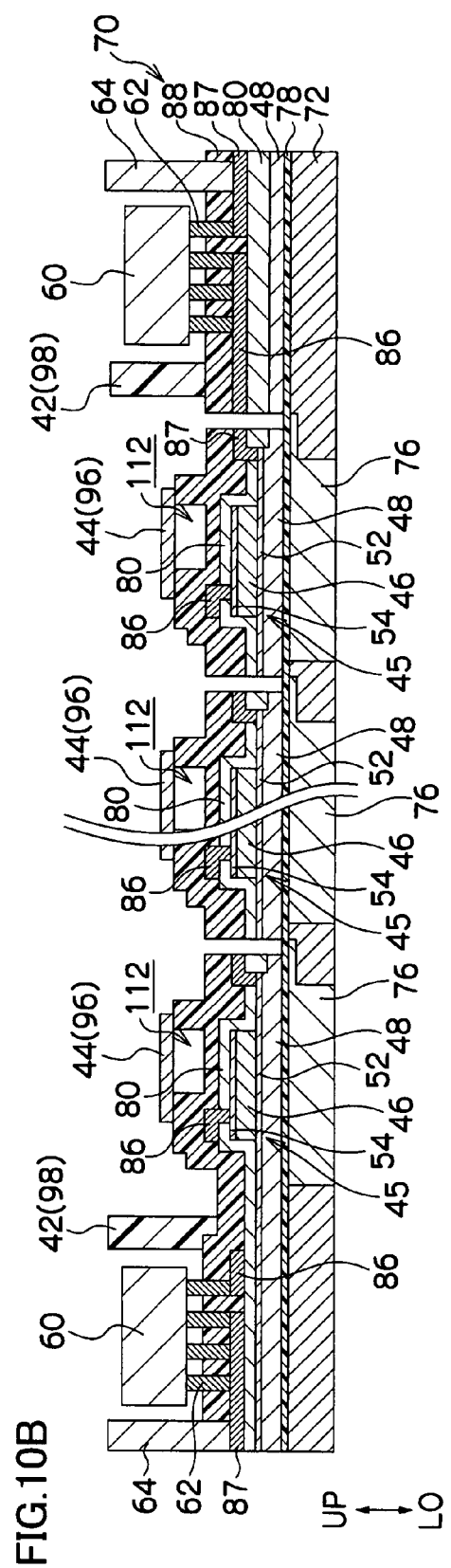

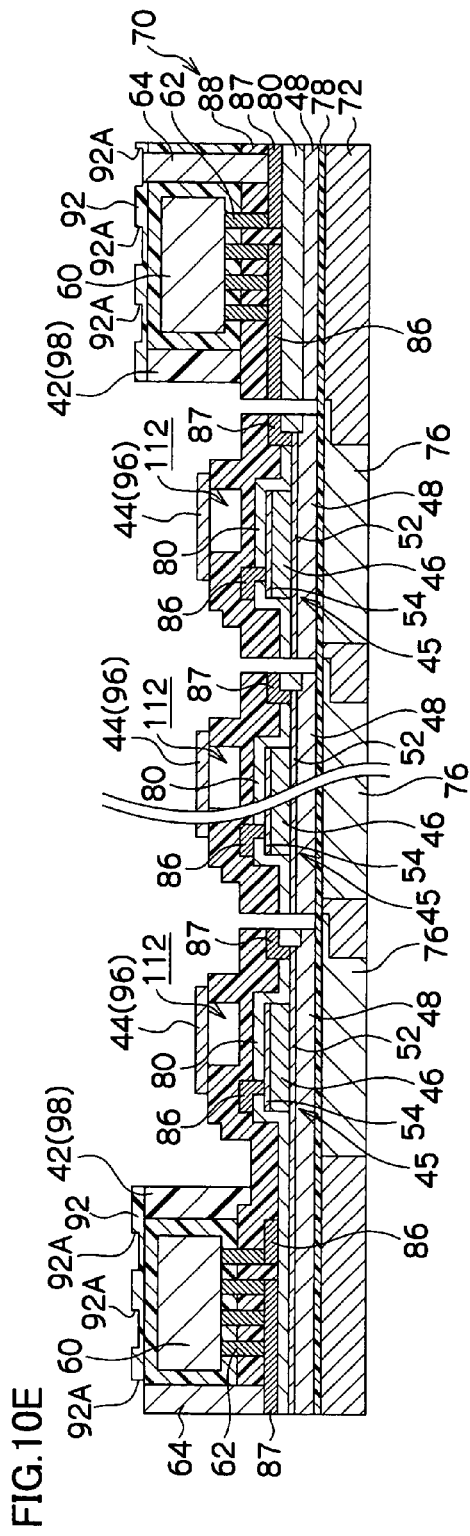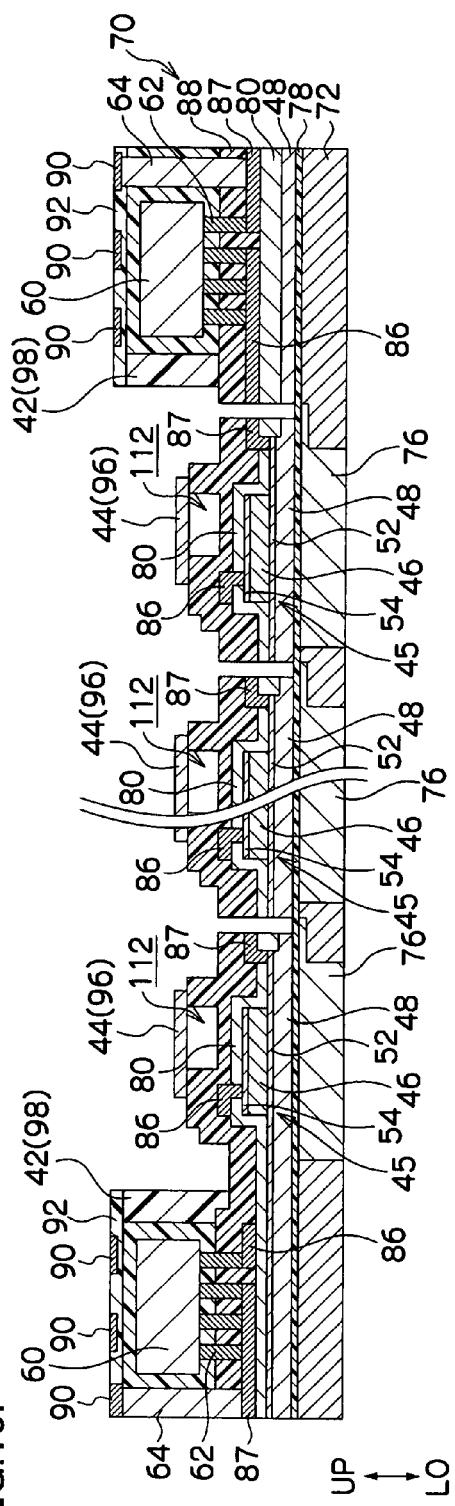

PIEZOELECTRIC ELEMENT, LIQUID DROPLET EJECTING HEAD, IMAGE FORMING DEVICE, AND METHOD OF MANUFACTURING LIQUID DROPLET EJECTING HEAD

CROSS-REFERENCE TO RELATED APPLICATION

This application is based on and claims priority under 35 USC 119 from Japanese Patent Application No. 2006-338332 filed on Dec. 15, 2006.

BACKGROUND

1. Technical Field

The present invention relates to a piezoelectric element, a liquid droplet ejecting head, an image forming device, and a method of manufacturing a liquid droplet ejecting head.

2. Related Art

There have conventionally been known inkjet recording devices (image forming devices) which selectively eject ink droplets from plural nozzles of an inkjet recording head, which is an example of a liquid droplet ejecting head, and record an image (including characters) or the like onto a recording medium such as a recording sheet or the like. The inkjet recording head of such an inkjet recording device ejects ink, which is filled in a pressure chamber, from the nozzle by displacing a vibrating plate which structures the pressure chamber. A piezoelectric element for displacing the vibrating plate is formed on the vibrating plate.

SUMMARY

A piezoelectric element of a first aspect of the present invention includes: a lower electrode that is formed on a surface of a vibrating plate, and is one polarity of the piezoelectric element that displaces the vibrating plate; a flexurally-deformable piezoelectric body that is formed on a surface of the lower electrode by a vacuum deposition method; and an upper electrode that is formed on a surface of the piezoelectric body, and is another polarity of the piezoelectric element, polarization of the piezoelectric body being oriented in a direction from the lower electrode toward the upper electrode.

BRIEF DESCRIPTION OF THE DRAWINGS

Exemplary embodiments of the present invention will be described in detail based on the following figures, wherein:

FIGS. 10A through 10F are explanatory drawings showing processes of manufacturing the piezoelectric element substrate on the silicon substrate of the inkjet recording head relating to the exemplary embodiments of the present invention.

DETAILED DESCRIPTION

Figure 1:
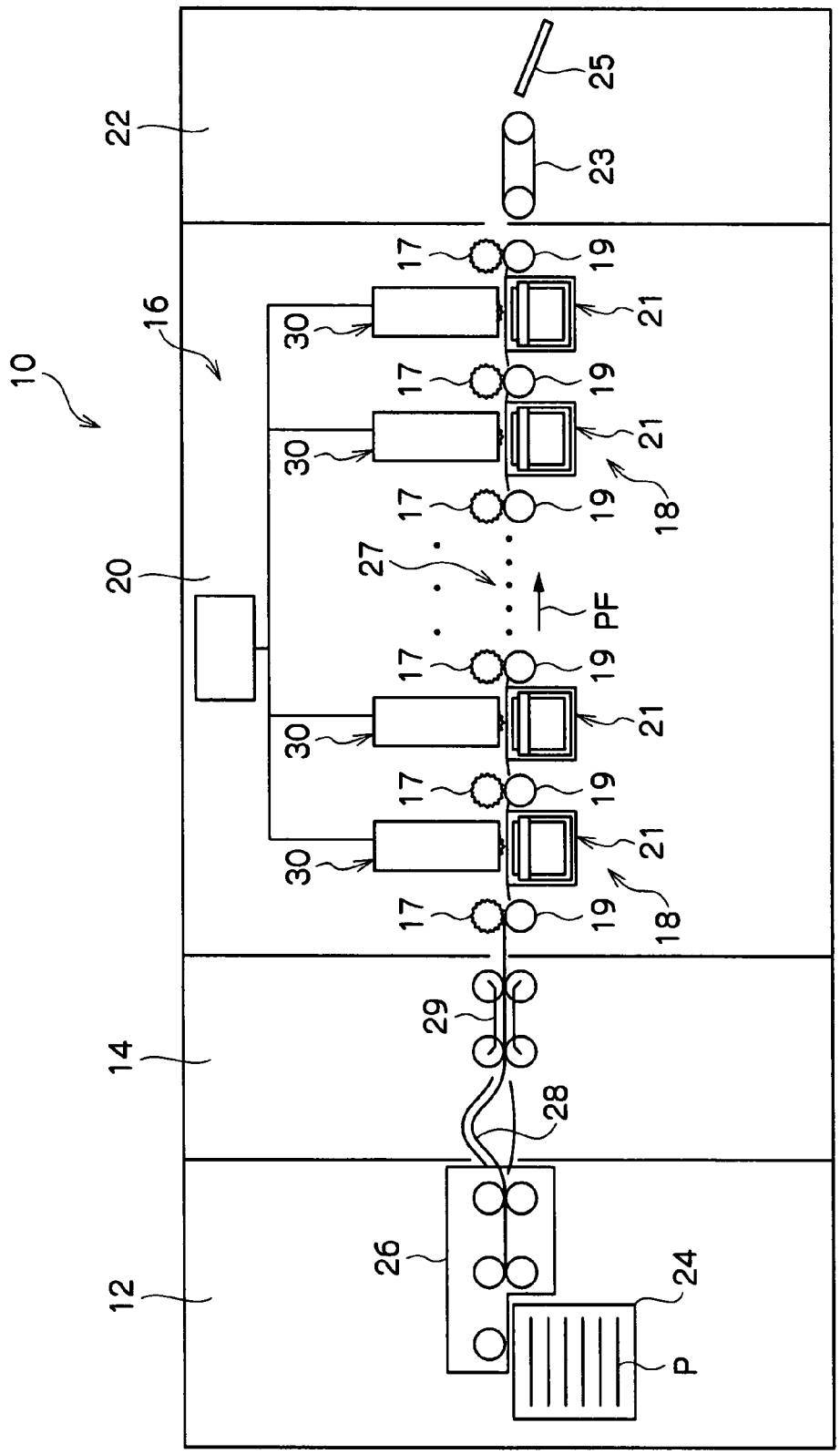
FIG. 1 is schematic front view showing an inkjet recording device relating to exemplary embodiments of the present invention.

Hereinafter, preferred exemplary embodiments of the present invention will be described in detail on the basis of the examples illustrated in the drawings. Note that description will be given by using an inkjet recording device 10 as an example of an image forming device. Accordingly, description is given with the liquid being an ink 110, and the liquid droplet ejecting head being an inkjet recording head 32. Further, description is given with the recording medium being a recording sheet P.

As shown in FIG. 1, the inkjet recording device 10 is basically structured from a sheet supplying section 12 which feeds-out the recording sheet P; a registration adjusting section 14 controlling the posture of the recording sheet P; a recording section 20 having a recording head portion 16 which ejects ink droplets and forms an image on the recording sheet P, and a maintenance portion 18 which carries out maintenance of the recording head portion 16; and a discharging section 22 discharging the recording sheet P on which an image has been formed at the recording section 20.

The sheet supplying section 12 is structured from a stocker 24 in which the recording sheets P are layered and stocked, and a conveying device 26 which removes the recording sheet P one-by-one from the stocker 24 and conveys it to the registration adjusting section 14. The registration adjusting section 14 has a loop forming portion 28 and a guide member 29 which controls the posture of the recording sheet P. Due to the recording sheet P passing through this section, the skew is corrected by utilizing the stiffness of the recording sheet P, and the conveying timing is controlled, and the recording sheet P is supplied to the recording section 20. Further, via a sheet discharging belt 23, the discharging section 22 accommodates the recording sheet P, on which an image has been formed at the recording section 20, at a tray 25.

A sheet conveying path 27 along which the recording sheet P is conveyed is structured between the recording head portion 16 and the maintenance portion 18 (the sheet conveying direction is shown by arrow PF). The sheet conveying path 27 has star wheels 17 and conveying rollers 19, and continuously (without stoppage) conveys the recording sheet P while nipping the recording sheet P between the star wheels 17 and the conveying rollers 19. Ink droplets are ejected from the recording head portion 16 onto the recording sheet P, and an image is formed on the recording sheet P. The maintenance portion 18 has maintenance devices 21 which are disposed so as to oppose inkjet recording units 30, and carries out processings such as capping, wiping, preliminary ejecting, suctioning, and the like on the inkjet recording heads 32.

Figure 2:
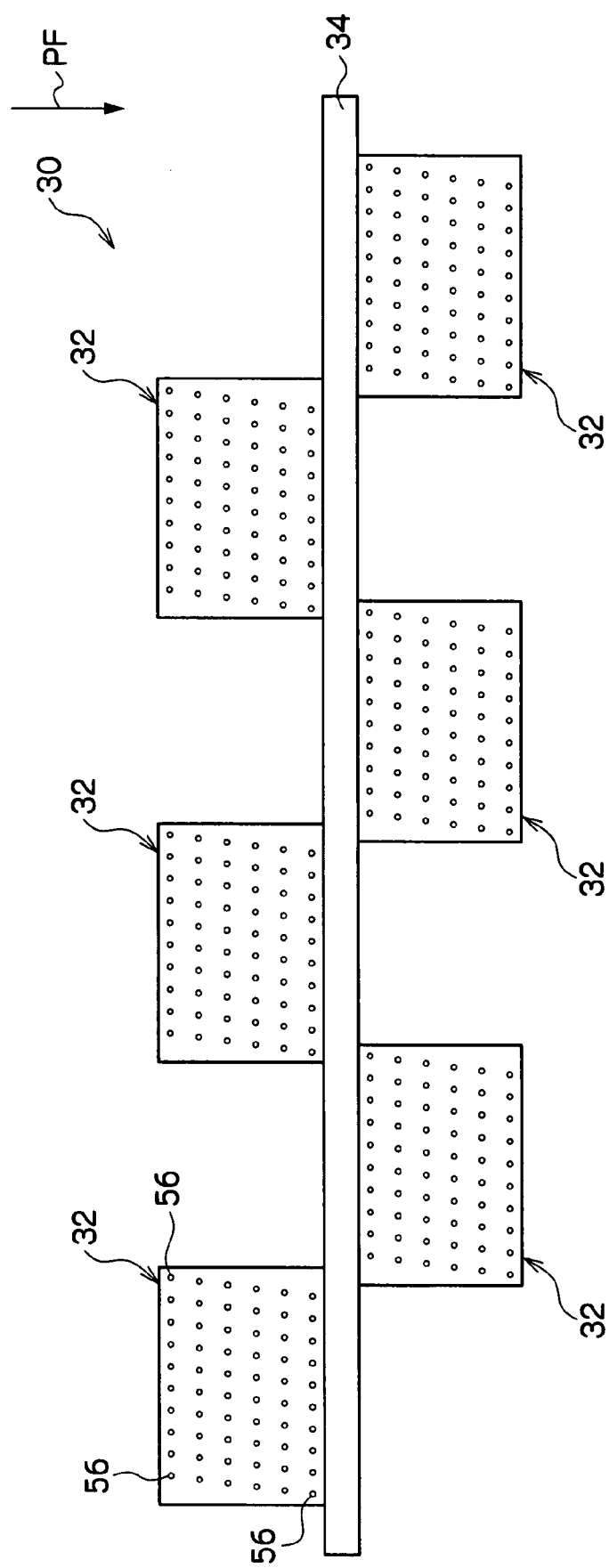
FIG. 2 is an explanatory drawing showing an array of inkjet recording heads relating to the exemplary embodiments of the present invention.

As shown in FIG. 2, each inkjet recording unit 30 has a supporting member 34 which is disposed in a direction orthogonal to the sheet conveying direction shown by arrow PF. A plurality of the inkjet recording heads 32 are mounted to the supporting member 34. A plurality of nozzles 56 are formed in the form of a matrix at the inkjet recording head 32, such that the nozzles 56 are lined-up at a uniform pitch in the transverse direction of the recording sheet P as the overall inkjet recording unit 30.

An image is recorded on the recording sheet P by ink droplets being ejected from the nozzles 56 onto the recording sheet P which is conveyed continuously along the sheet conveying path 27. Note that at least four of the inkjet recording units 30 are disposed in correspondence with the respective colors of yellow (Y), magenta (M), cyan (C), and black (K) in order to record a so-called full-color image for example.

Figure 3:
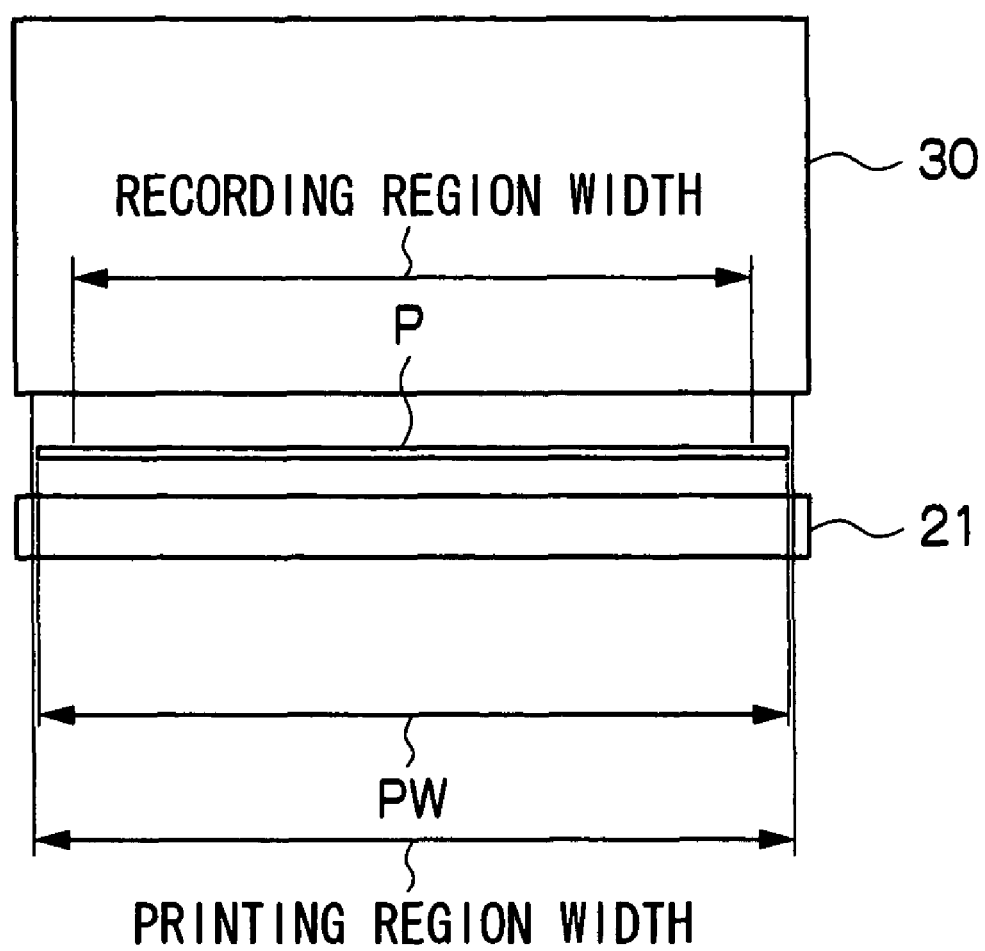
FIG. 3 is an explanatory drawing showing the relationship between the width of a recording medium and the width of a printing region of the inkjet recording head relating to the exemplary embodiments of the present invention.

As shown in FIG. 3, the width of the printing region by the nozzles 56 of each inkjet recording unit 30 is longer than a maximum sheet width PW of the recording sheet P for which image recording at the inkjet recording device 10 is supposed, such that image recording over the entire width of the recording sheet P is possible without moving the inkjet recording unit 30 in the transverse direction of the sheet.

Here, the basic width of the printing region is the maximum width among recording regions from which margins, at which printing is not carried out, are subtracted from the both ends of the recording sheet P, and generally, is larger than the maximum sheet width PW which is the object of printing. This is because there is the concern that the recording sheet P will be conveyed while inclined at a predetermined angle with respect to the conveying direction (i.e., while skewed), and because the demand for borderless printing is high.

Figure 4:
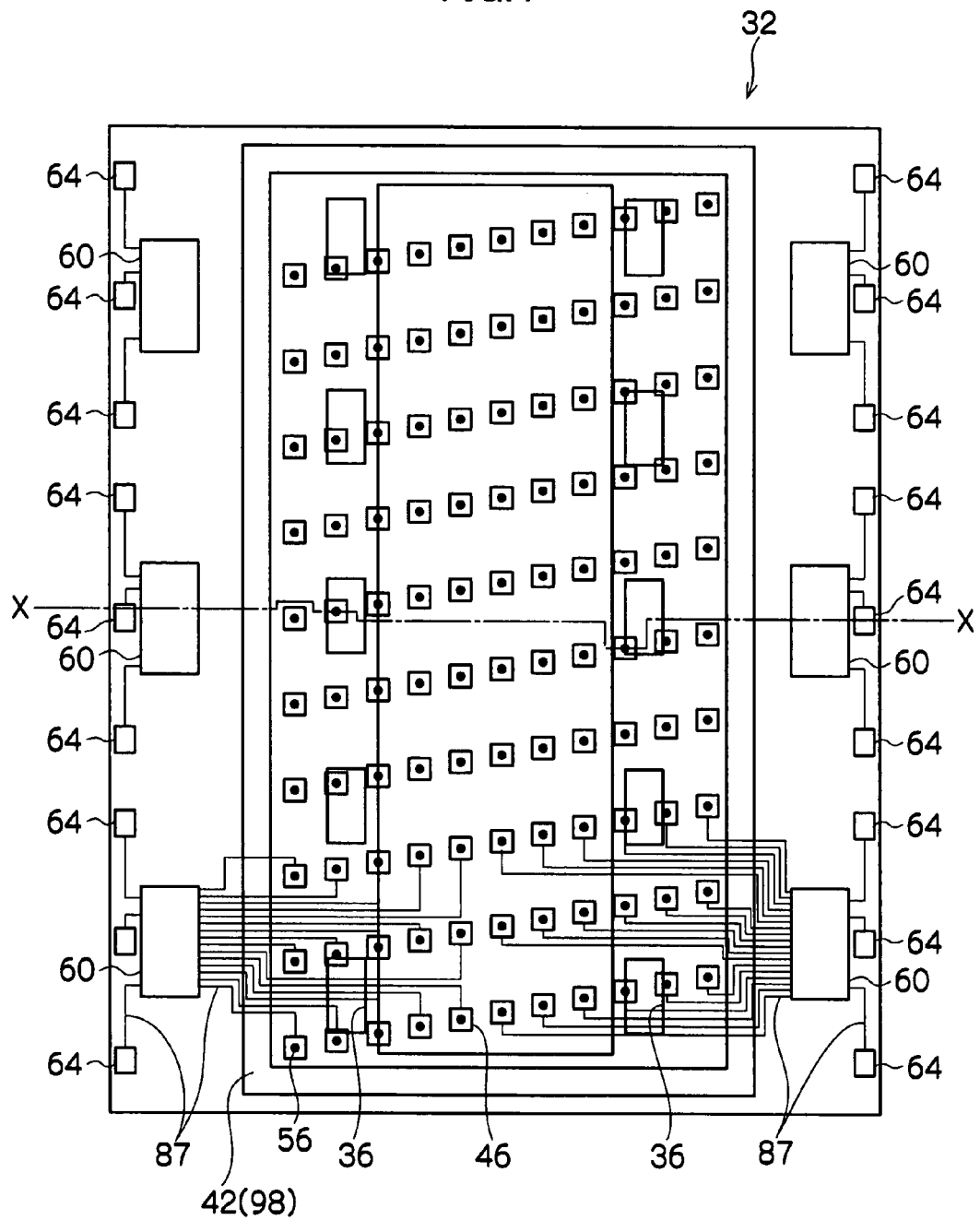
FIG. 4 is a schematic plan view of the inkjet recording head relating to the exemplary embodiments of the present invention.
Figure 5:
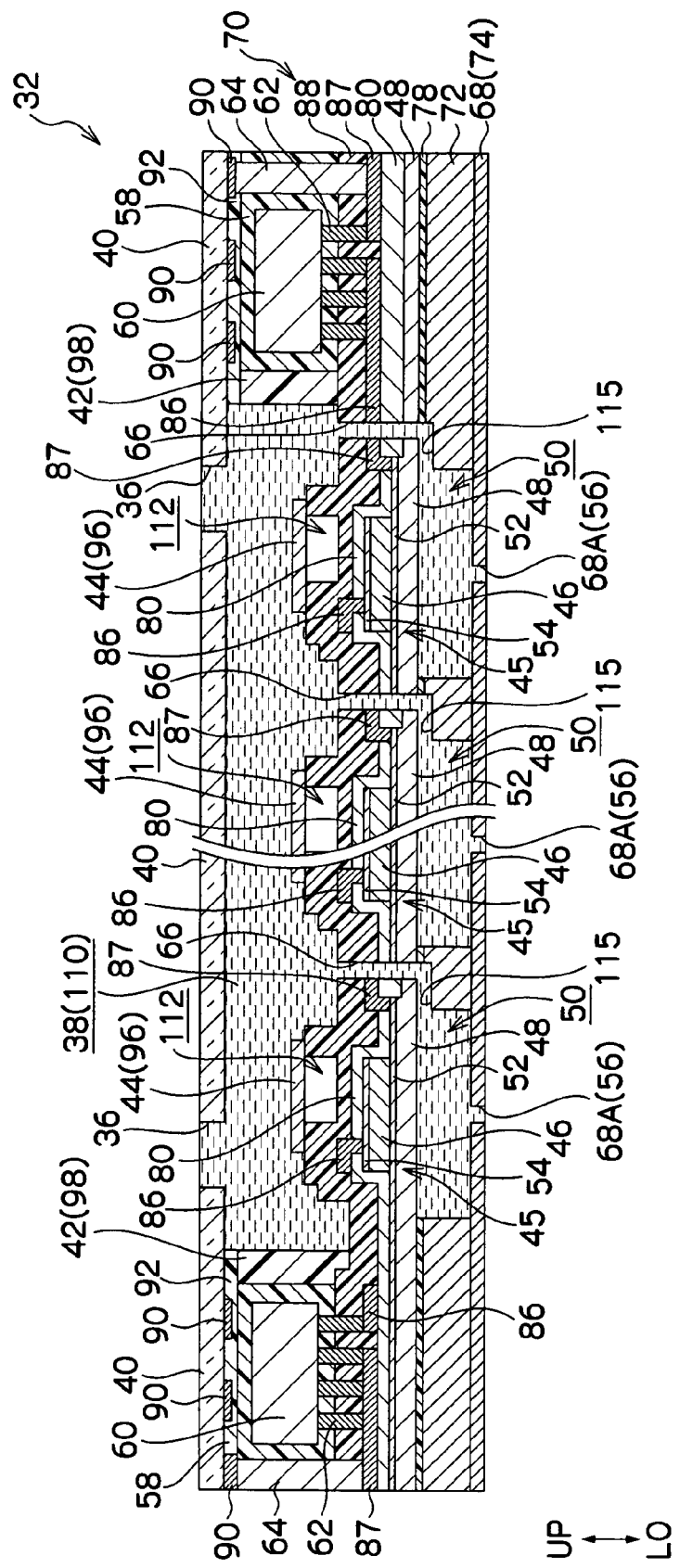
FIG. 5 is a cross-sectional view along line X-X in FIG. 4.
Figure 6:
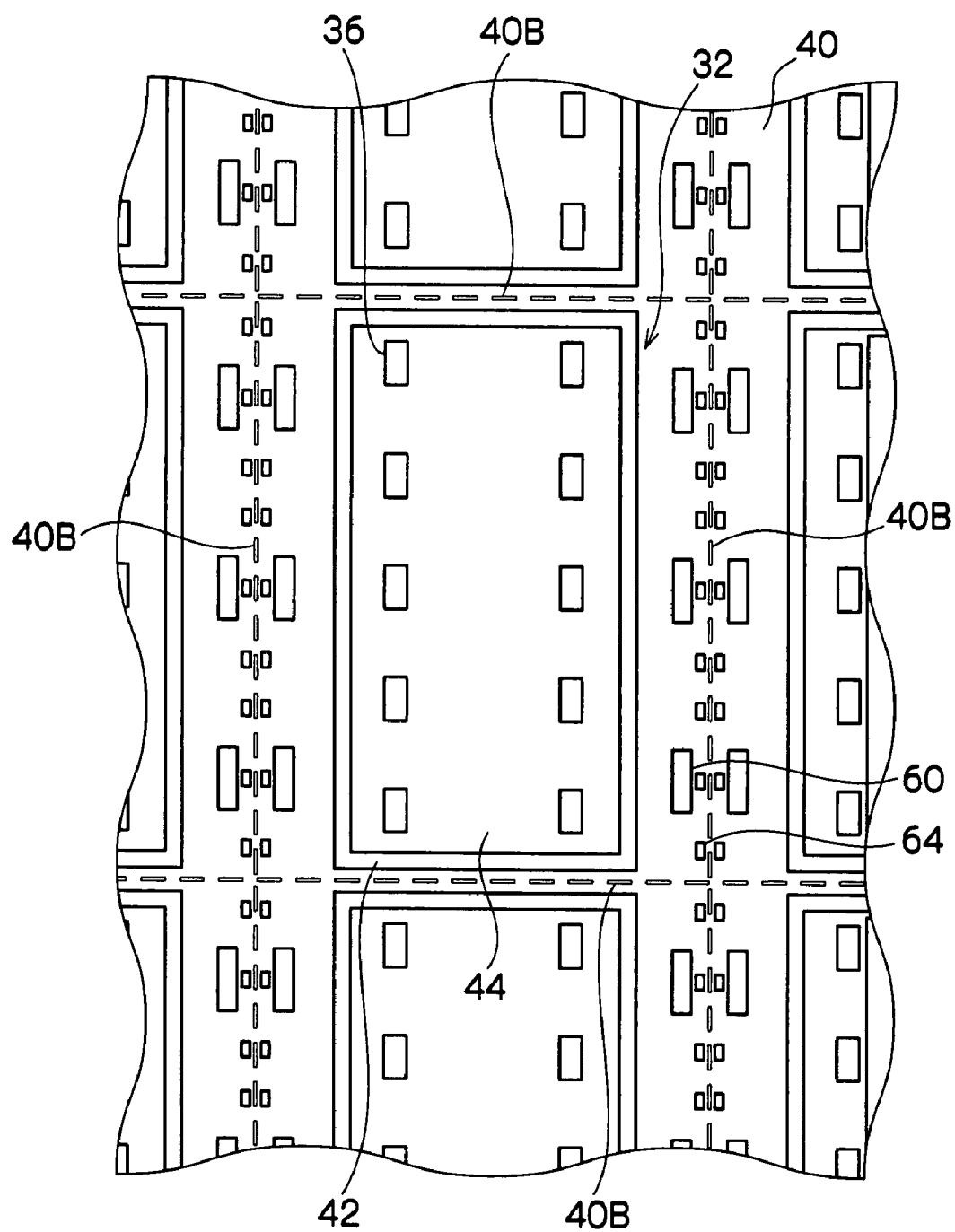
FIG. 6 is a schematic plan view showing a ceiling plate before being cut into the inkjet recording heads relating to the exemplary embodiments of the present invention.

Next, the inkjet recording head 32 in the inkjet recording device 10 of the above-described structure will be described in detail. Note that FIG. 4 is a schematic plan view showing the overall structure of the inkjet recording head 32, and FIG. 5 is a cross-sectional view along line X-X in FIG. 4. Further, FIG. 6 is a schematic plan view showing a ceiling plate 40 before being cut into the inkjet recording heads 32.

As shown in FIG. 4 and FIG. 5, ink supply ports 36, which are connected to an ink tank (not shown), are provided at the inkjet recording head 32. The ink 110, which is injected-in from these ink supply ports 36, is stored in an ink pooling chamber (liquid pooling chamber) 38.

The volume of the ink pooling chamber 38 is regulated by the ceiling plate 40 and a partitioning wall 42. A plurality of the ink supply ports 36 are formed in lines at predetermined places of the ceiling plate 40. Further, air dampers 44 (a photosensitive dry film 96 which will be described later), which are made of resin film and mitigate pressure waves, are provided in the ink pooling chamber 38, further toward the inner side than the ceiling plate 40 and between the ink supply ports 36 which form the lines.

Any material, such as glass, ceramic, silicon, resin, or the like for example, may be used as the material of the ceiling plate 40, provided that it is an insulator which has strength such that it can become the support of the inkjet recording head 32. Further, metal wires 90, which are for energizing driving ICs 60 which will be described later, are provided at the ceiling plate 40. The metal wires 90 are covered and protected by a resin film 92, such that erosion of the metal wires 90 by the ink 110 is prevented.

The partitioning wall 42 is molded of resin (a photosensitive dry film 98 which will be described later), and partitions the ink pooling chamber 38 into a rectangular shape. Further, the ink pooling chamber 38 is separated, above and below, into piezoelectric elements 45 and pressure chambers 50, via vibrating plates 48 which are flexurally deformed in the vertical direction by the piezoelectric elements 45. Namely, the piezoelectric elements 45 and the vibrating plates 48 are structured so as to be disposed between the ink pooling chamber 38 and the pressure chambers 50, and the ink pooling chamber 38 and the pressure chambers 50 are structured so as to not exist on the same horizontal plane.

Accordingly, the pressure chambers 50 can be disposed in states of being near to one another, and the nozzles 56 can be disposed at a high density in the form of a matrix.

The vibrating plate 48 is a three-layer structure formed by $SiO_2$ films, to which no impurities are added, being layered on and beneath a silicon oxide film ($SiO_2$ film) to which germanium (Ge) is added, by Plasma-Chemical Vapor Deposition (P-CVD). The vibrating plate 48 is elastic at least in the vertical direction. When the piezoelectric element 45 is energized (i.e., when voltage is applied to the piezoelectric element 45), the vibrating plate 48 flexurally deforms (is displaced) in the vertical direction. Other than this, a layered film of silicon and silicon oxide films, or the like, may be used as the vibrating plate. In this case, the vibrating plate is fabricated by using an SOI wafer as the base substrate. Note that the thickness of the vibrating plate 48 is greater than or equal to 1 μm and less than or equal to 20 μm (1 μm to 20 μm) in order to obtain stable rigidity.

The piezoelectric element 45 is provided on the top surface of the vibrating plate 48, at each of the pressure chambers 50. Lower electrodes 52, which are one polarity of the piezoelectric elements 45, are disposed at the bottom surfaces of piezoelectric bodies 46 structuring the piezoelectric elements 45. Upper electrodes 54, which are the other polarity, are disposed on the top surfaces of the piezoelectric bodies 46.

The upper electrodes 54, the piezoelectric bodies 46, and the lower electrodes 52 are covered and protected by a low water permeable insulating film (hereinafter called "$SiO_x$ film") 80 which serves as a protective film. The $SiO_x$ film 80, which covers and protects the piezoelectric elements 45, is formed under the condition that the moisture permeability is low. Therefore, the $SiO_x$ film 80 can prevent poor reliability due to moisture penetrating into the piezoelectric elements 45 (a deterioration in the piezoelectric characteristic caused by the oxygen within PZT films 65, which serve as the piezoelectric bodies 46, being reduced).

The top surface of the low water permeable insulating film ($SiO_x$ film) 80 and metal wires 86, 87 are covered and protected by a resin protective film 88, such that erosion due to the ink 110 is prevented.

At the regions above the piezoelectric elements 45, the resin protective film 88 is formed to be thin, such that impeding of the displacement of the piezoelectric elements 45 (the vibrating plates 48) is prevented (the piezoelectric elements 45 (the vibrating plates 48) can flexurally deform appropriately in the vertical direction). Namely, at the resin layer above the piezoelectric element 45, the thinner the layer, the better the effect of suppressing the impeding of displacement, and therefore, the resin protective film 88 is formed to be thin. Further, the air damper 44 (the photosensitive dry film 96 which will be described later), which is made of resign film and mitigates pressure waves, is provided at the top surface of the resin protective film 88 positioned above the piezoelectric element 45, so as to oppose the piezoelectric element 45.

On the other hand, the driving ICs 60 are disposed at the outer sides of the ink pooling chamber 38 which is prescribed by the partitioning wall 42, and between the ceiling plate 40 and the vibrating plates 48. The driving ICs 60 are structured so as to not be exposed (not project out) from the vibrating plates 48 or the ceiling plate 40. Accordingly, the inkjet recording head 32 can be made more compact.

The peripheries of the driving ICs 60 are sealed by a resin material 58. A plurality of injection openings 40B for the resin material 58 which seals the driving ICs 60 are formed in the ceiling plate 40 in the manufacturing step shown in FIG. 6, in a grid-like form so as to partition the respective inkjet recording heads 32. After the forming of a piezoelectric element substrate 70 which will be described later, the ceiling plate 40 is cut along the injection openings 40B which are sealed (blocked) by the resin material 58. In this way, a plurality of the inkjet recording heads 32, which have the nozzles 56 (see FIG. 4) in a matrix form, are manufactured at one time.

Figure 7:
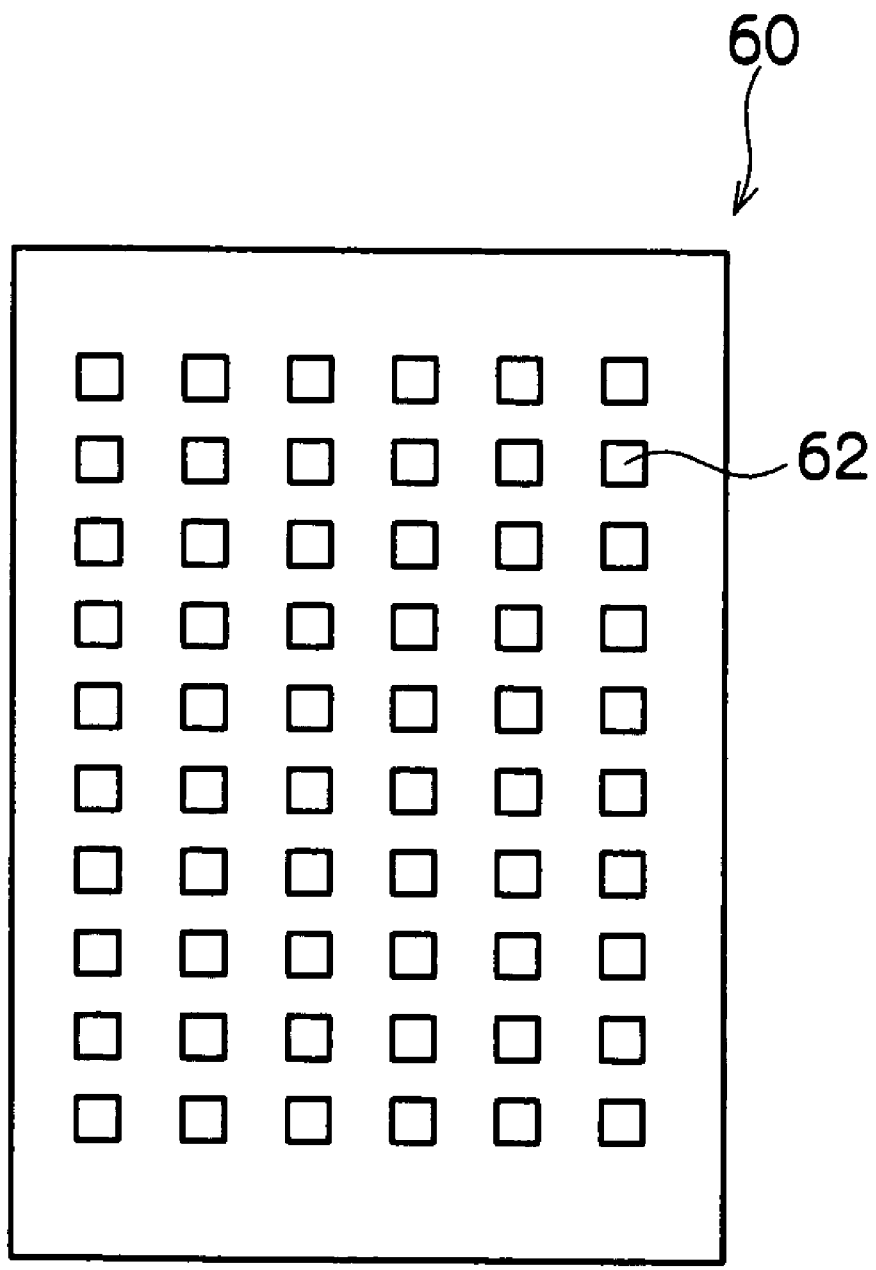
FIG. 7 is a schematic plan view showing bumps of a driving IC of the inkjet recording head relating to the exemplary embodiments of the present invention.

As shown in FIG. 5 and FIG. 7, a plurality of bumps 62 project out by predetermined heights and in the form of a matrix at the bottom surface of the driving IC 60, and are flip-chip mounted to the metal wires 86, 87 disposed at the piezoelectric element substrate 70. Accordingly, high-density connection to the piezoelectric elements 45 can be realized easily, and a reduction in the height of the driving IC 60 is devised (the driving IC 60 can be made thinner). For this reason as well, the inkjet recording head 32 can be made to be compact. Note that, here, the metal wires 86 which are connected to the upper electrodes 54 are ground potential (as will be described later).

Bumps 64 are provided at the outer sides of the driving ICs 60 in FIG. 5. The bumps 64 connect metal wires 90 provided at the ceiling plate 40, and the metal wires 87 provided at the piezoelectric element substrate 70. The bumps 64 are of course provided so as to be higher than the heights of the driving ICs 60 mounted on the piezoelectric element substrate 70.

Accordingly, the metal wires 90 of the ceiling plate 40 are energized from a driving circuit 11 (see FIG. 1) at the main body of the inkjet recording device 10, and the metal wires 87 are energized from the metal wires 90 of the ceiling plate 40 via the bumps 64, and the driving ICs 60 are energized therefrom. Voltage is applied to the piezoelectric elements 45 at predetermined times from the driving ICs 60, such that the vibrating plates 48 are flexurally deformed in the vertical direction. The ink 110 filled in the pressure chambers 50 is thereby pressurized, and ink droplets are ejected from the nozzles 56.

One nozzle 56 which ejects the ink droplets is provided for each pressure chamber 50, at a predetermined position thereof. The pressure chamber 50 and the ink pooling chamber 38 are connected by an ink flow path 66 and a communicating path 115 being connected. The ink flow path 66 side-steps the piezoelectric element 45 and passes through the vibrating plate 48. The communicating path 115 extends horizontally in FIG. 5 from the pressure chamber 50.

Figure 8:
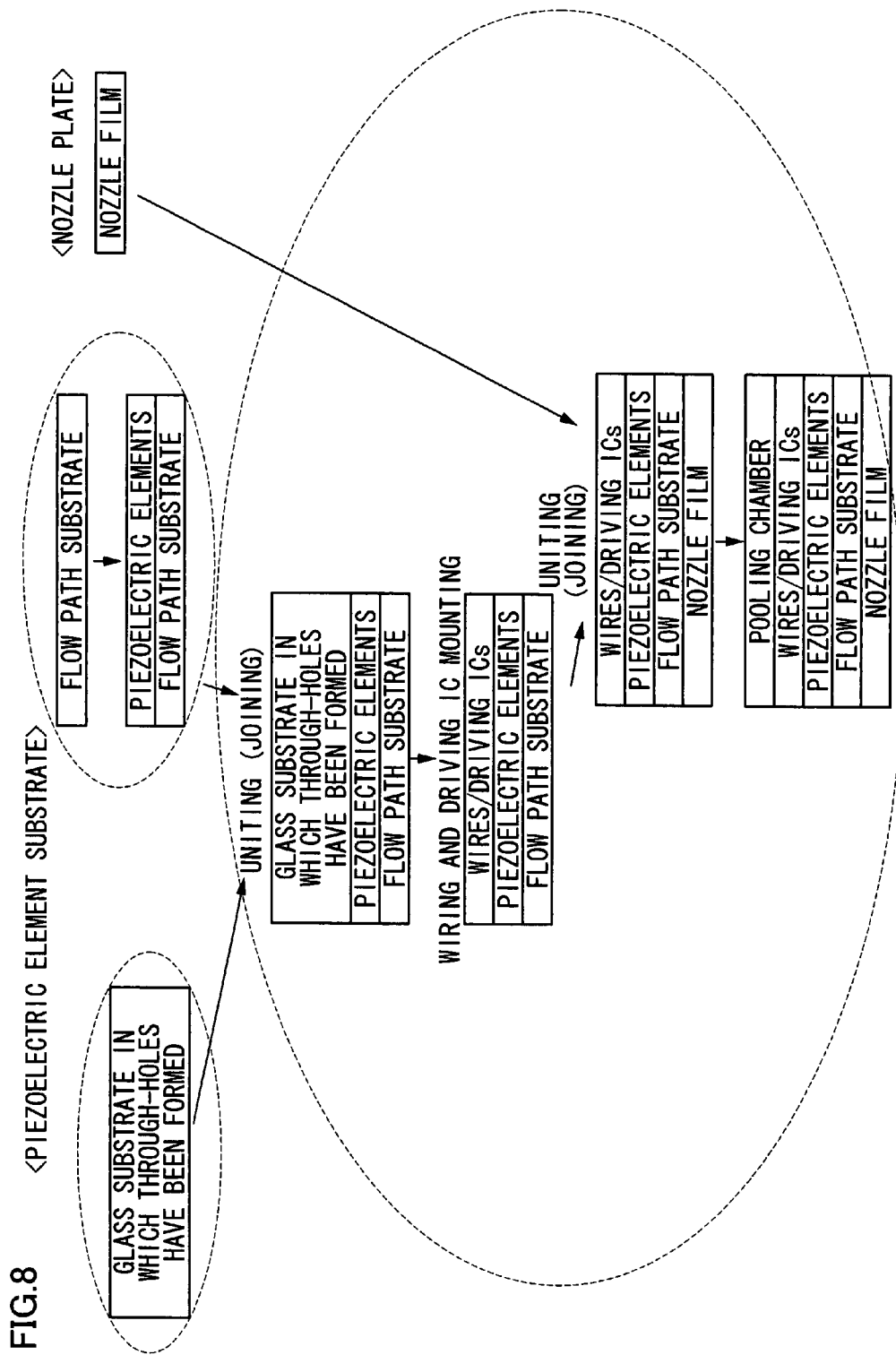
FIG. 8 is an explanatory drawing showing the overall process of manufacturing the inkjet recording head relating to the exemplary embodiments of the present invention.

Next, the manufacturing processes of the inkjet recording head 32, which is structured as described above, will be described in detail on the basis of FIG. 8 through FIG. 11B. As shown in FIG. 8, the inkjet recording head 32 is manufactured by fabricating the piezoelectric element substrate 70 on the top surface of a silicon substrate 72 which serves as a pressure chamber plate, and then joining (affixing) a nozzle plate 74 (a nozzle film 68) to the bottom surface of the silicon substrate 72.

Figure 9A:
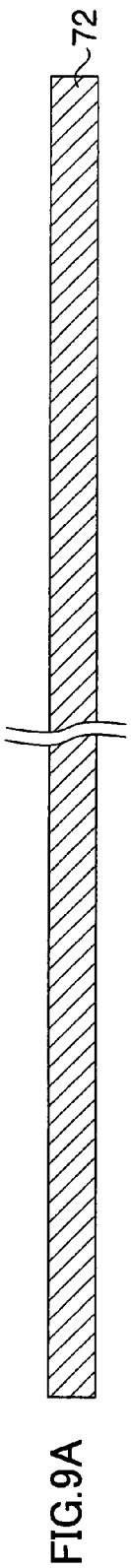
FIGS. 9A through 9P are explanatory drawings showing processes of manufacturing a piezoelectric element substrate on a silicon substrate of the inkjet recording head relating to the exemplary embodiments of the present invention.
Figure 9B:
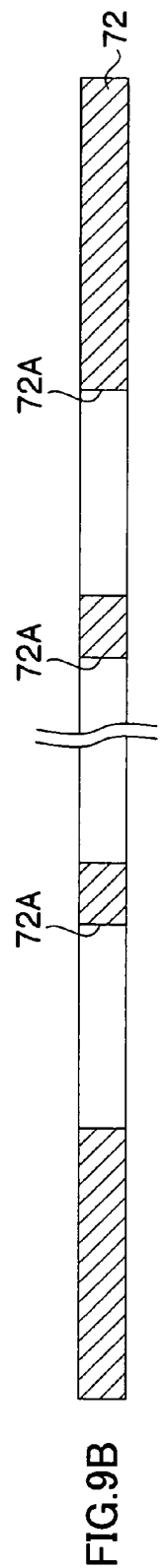

As shown in FIG. 9A, first, the silicon substrate 72 is readied. Then, as shown in FIG. 9B, opening portions 72A are formed in regions of the silicon substrate 72 which become the pressure chambers 50, by Reactive Ion Etching (RIE). Specifically, this is resist formation by photolithography, patterning, etching by RIE, and resist removal by oxygen plasma.

Figure 9C:
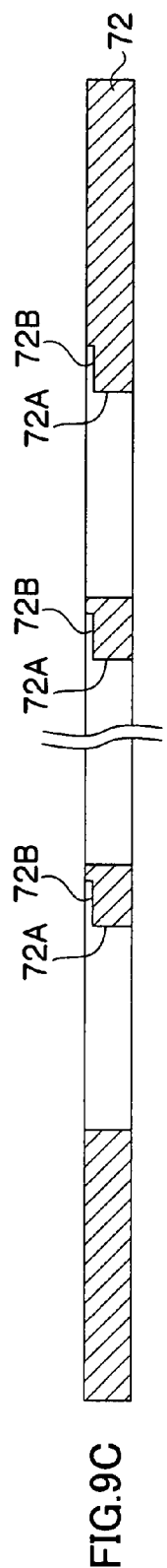

Next, as shown in FIG. 9C, groove portions 72B are formed by RIE at regions of the silicon substrate 72 which become the communicating paths 115. Specifically, in the same way as described above, this is resist formation by photolithography, patterning, etching by RIE, and resist removal by oxygen plasma. In this way, the multi-step structure formed from the pressure chamber 50 and the communicating path 115 is formed.

Figure 9D:
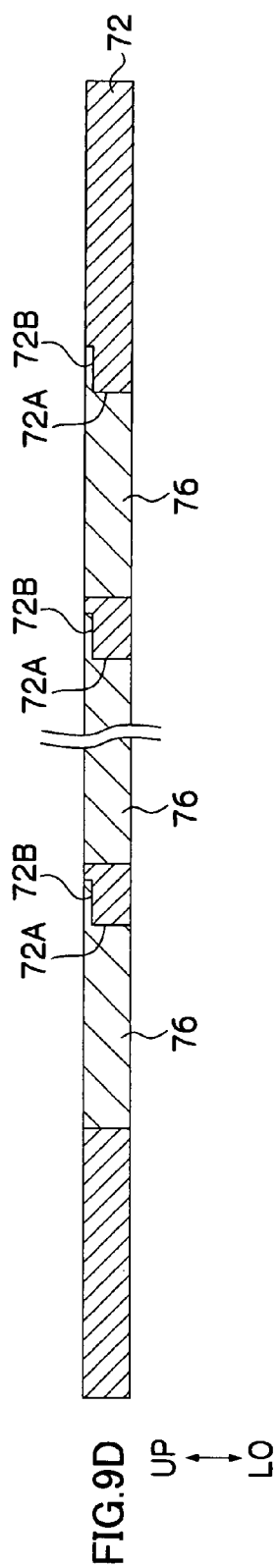

Thereafter, as shown in FIG. 9D, a glass paste 76 is filled (buried) by screen printing into the opening portions 72A which structure the pressure chamber, and the groove portions 72B which structure the communicating paths. Using screen printing is preferable because the glass paste 76 can reliably be buried even into the deep opening portions 72A and groove portions 72B.

The thermal expansion coefficient of this glass paste 76 is $1\times10^{-6}/°$ C. to $6\times10^{-6}/°$ C., and the softening point thereof is 550° C. to 900° C. By using the glass paste 76 which is within this range, cracking and peeling can be prevented from arising at the glass paste 76, and further, shape distortion can be prevented from arising at the films which become the piezoelectric elements 45 and the vibrating plates 48.

After the filling of the glass paste 76, the silicon substrate 72 is subjected to heating processing, for example, at 800° C. for 10 minutes. The temperature which is used in the curing by heat treatment of the glass paste 76 is a temperature which is higher than the film forming temperature of the piezoelectric elements 45 (e.g., 550° C.) and the film forming temperature of the vibrating plate 48 (e.g., 700° C.) which will be described later. In this way, the glass paste 76 can be made to be resistant to high temperatures in the film forming processes of the vibrating plate 48 and the piezoelectric elements 45.

Namely, temperatures up to the temperature at which at least the glass paste 76 is cured by heat treatment can be used in later processes, and therefore, the allowable range of temperatures which can be used in the later processes is broadened. Thereafter, the top surface (obverse) of the silicon substrate 72 is polished and the excess glass paste 76 is removed, such that the top surface (obverse) is planarized. In this way, thin films and the like can be formed precisely also on the regions which become the pressure chambers 50 and the communicating paths 115.

Next, as shown in FIG. 9E, a germanium (Ge) film 78 (film thickness: 1 µm) is film-formed by sputtering on the top surface (obverse) of the silicon substrate 72. This Ge film 78 functions as an etching stopper layer which, when the glass paste 76 is removed by etching by a hydrogen fluoride (HF) solution in a later process, protects such that the vibrating plates 48 (SiO$_2$ film) are not etched together therewith. Note that the Ge film 78 can also be film-formed by vapor deposition or CVD. Further, a silicon (Si) film also can be used as the etching stopper layer.

Then, as shown in FIG. 9F, the thin film which becomes portions of the vibrating plates 48, i.e., the SiO$_2$ film (film thickness: 0.4 µm) to which no impurities are added, is film-formed on the top surface of the Ge film 78 by P-CVD. Next, the thin film which becomes portions of the vibrating plates 48, i.e., the SiO$_2$ film (film thickness: 9.2 µm) to which Ge is added, is film-formed by P-CVD. Further, the thin film which becomes portions of the vibrating plates 48, i.e., the SiO$_2$ film (film thickness: 0.4 µm) to which no impurities are added, is film-formed by P-CVD.

Specifically, film-formation is carried out by adding tetramethyl germanium (TMGe) which is an alkoxide gas to a gas containing oxygen (O$_2$) and silicon (Si) raw materials, e.g., a gas containing any of tetraethoxysilane (TEOS), tetramethoxysilane (TMOS), or silane (SiH$_4$). Note that, at this time, the thickness of the SiO$_2$ film to which Ge is added is made to be greater than or equal to ½ of the entire thickness of the vibrating plate 48.

When the SiO$_2$ films have been continuously film-formed in this way, they are annealed (thermally processed) in a nitrogen (N$_2$) atmosphere for one hour at a temperature, e.g., 700° C., which is higher than the maximum temperature in the processes thereinafter. When annealing is carried out at 700° C., the stress value of the vibrating plate 48 increases several tens of MPa, but, once the annealing is carried out, the stress does not change any more than that. Note that the annealing temperature is not limited to 700° C., and it suffices for the annealing temperature to be greater than or equal to 600° C. and less than or equal to 1100° C. (600° C. through 1100° C.).

When the SiO$_2$ films are film-formed and annealed such that the vibrating plate 48 of the three-layer structure is formed, as shown in FIG. 9G, a layered film (lower electrode layer) 63 of Ir and Ti and a thickness of about 0.5 µm for example, is film-formed on the top surface of the vibrating plate 48 by sputtering (lower electrode layer forming step).

Then, as shown in FIG. 9H, a PZT film (piezoelectric body layer) 65 which is the material of the piezoelectric bodies 46, is layered (film-formed) by sputtering on the top surface of the layered film 63 which will become the lower electrodes 52 (piezoelectric body layer forming step). Thereafter, an Ir film (upper electrode layer) 67 which will become the upper electrodes 54 is layered (film-formed) by sputtering (upper electrode layer forming step). Thereafter, as shown in FIG. 9I, the PZT film 65 and the Ir film 67 are patterned, and the piezoelectric bodies 46 and the upper electrodes 54 are formed.

Specifically, this is sputtering of the PZT film (film thickness: 5 µm), sputtering of the Ir film (film thickness: 0.5 µm), resist formation by photolithography, patterning (dry etching using a Cl$_2$ or an F gas), and resist removal by oxygen plasma. The materials of the lower electrodes 52 and the upper electrodes 54 have high affinity with the PZT material which is the piezoelectric bodies 46, and are heat-resistant. Examples include Ir, Au, Ru, Pt, Ta, PtO$_2$, TaO$_4$, IrO$_2$, and the like. Further, the film-forming temperature of the PZT film 65 is 550° C., and an AD method, a sol-gel method, or the like also can be used in the layering (film-forming) of the PZT film 65.

Figure 9J:
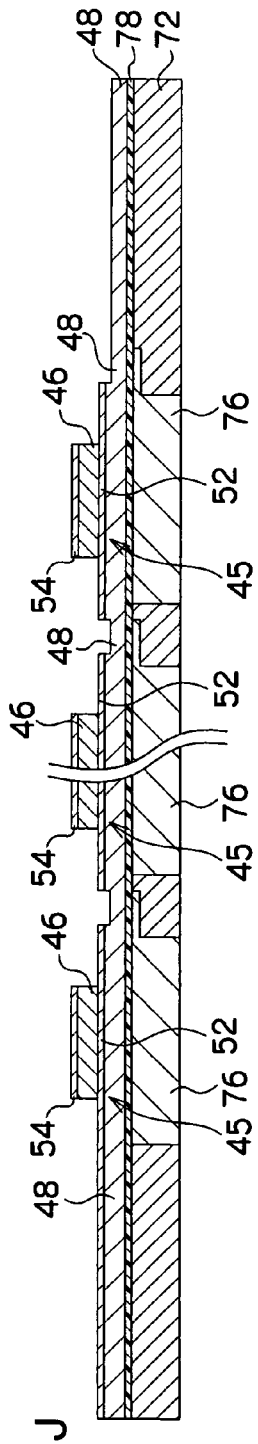

Next, as shown in FIG. 9J, the layered film 63 which is layered on the top surface of the vibrating plate 48 is patterned. Specifically, this is resist formation by photolithography, patterning, dry etching (using a Cl$_2$ gas) by RIE, and resist removal by oxygen plasma. Note that, in the dry etching, the regions of the vibrating plate 48 other than the portions thereof beneath the lower electrodes 52 are made to be thin.

In this way, in the process of forming the piezoelectric elements 45, the vibrating plate 48 is formed of SiO$_2$ at the silicon substrate 72, and the layered film 63 (lower electrodes 52) of Ir and Ti are formed on the top surface thereof. Then, the PZT film 65 (piezoelectric bodies 46) is formed on the top surface of the layered film 63, and the Ir film 67 (the upper electrodes 54) is formed on the top surface of the PZT film 65, such that a plate of a five-layer structure is formed. Then, the piezoelectric elements 45 are formed by respectively patterning the upper electrodes 54, the piezoelectric bodies 46, and the lower electrodes 52.

Figure 9K:
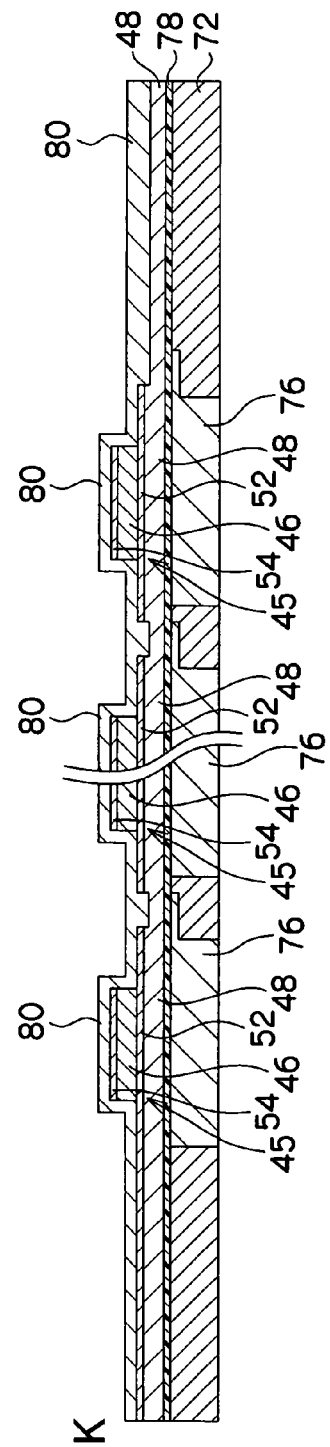

Next, as shown in FIG. 9K, the low water permeable insulating film (SiOx film) 80 is layered as a protective film on the top surfaces of the upper electrodes 54, the end surfaces of the piezoelectric bodies 46, the top surfaces of the lower electrodes 52, and the end surfaces of the vibrating plate 48, which are exposed at the surface.

Note that, although the SiOx film 80 (silicon oxide film) is used as the protective film here, an SiNx film (silicon nitride film), an SiOxNy film, or the like may be used. Further, SOG (Spin-On-Glass), a metal film of Ta, Ti, or the like, a metal oxide film of TaO$_2$, Ta$_2$O$_5$ or the like, a resin film, or the like may be used. The protective film may be a single layer film of any of these, or a multilayer film combining these. Oxide films, nitride films, SOG, metal films, and metal oxide films have excellent insulating ability, moisture-resistance, and an ability to suppress (mitigate) steps between the film layers, and thereamong, oxide films, nitride films, SOG, and metal films have excellent chemical (ink) resistance as well.

Figure 9L:
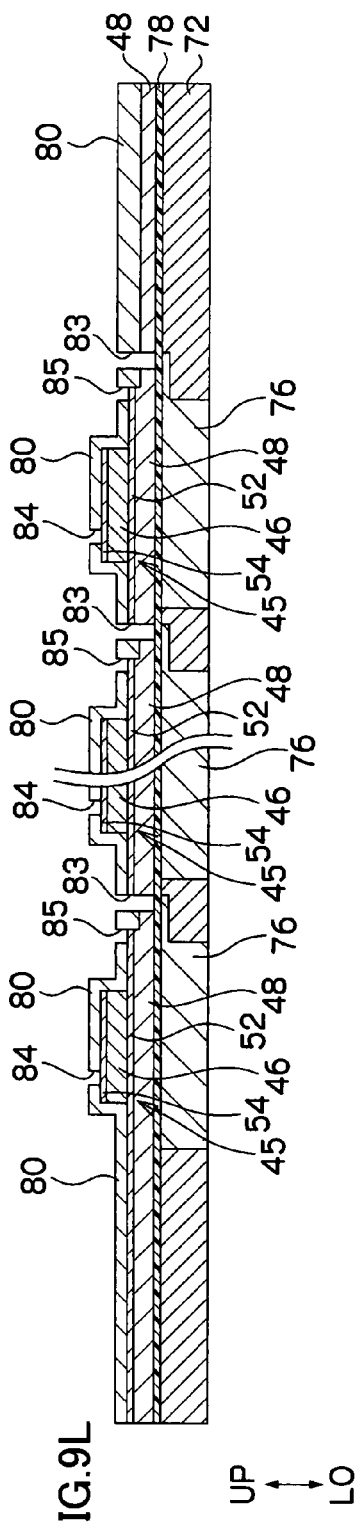

Then, as shown in FIG. 9L, ink supply openings 83 which structure the ink flow paths 66, which connect the ink pooling chamber 38 and the communicating paths 115 which extend horizontally from the pressure chambers 50, are formed by dry etching. Further, openings 84 (contact holes), for connecting the metal wires 86 (see FIG. 5) to the upper electrodes 54, and openings 85 (contact holes), for connecting the metal wires 87 to the lower electrodes 52, are formed by dry etching.

Next, as shown in FIG. 9M, a metal film is layered on the top surfaces of the upper electrodes 54 within the openings 84, the lower electrodes 52 within the openings 85, and the low water permeable insulating films (SiOx films) 80, and the metal wires 86, 87 are patterned. Specifically, the processes of deposition of an Al film (film thickness: 1 µm) by sputtering, resist formation by photolithography, etching of the Al film by RIE using a chlorine gas, and removal of the resist film by oxygen plasma, are carried out.

Then, as shown in FIG. 9N, the resin protective film 88 is patterned on the top surfaces of the metal wires 86, 87 and the SiOx film 80. Specifically, a photosensitive resin which structures the resin protective film 88 is coated on the SiOx film, and a pattern is formed by exposure and development, and finally, curing is carried out. At this time, the ink flow paths 66 are formed in the resin protective film 88. Further, it suffices for the photosensitive resin which structures the resin protective film 88 to be ink resistant, such as a polyimide resin, a polyamide resin, an epoxy resin, a polyurethane resin, a silicone resin, or the like. Moreover, at this time, above the piezoelectric elements 45, the resin protective film 88 is formed to be thin at the regions where the metal wires 86 are not patterned. To this end, after the resin protective film 88 is patterned, concave portions 112A are formed at predetermined regions by dry etching.

Note that, because the resin protective film 88 is formed of the same type of resin material as the partitioning wall 42 (the photosensitive dry film 98) which will be described later, the joining force to the partitioning wall 42 (the photosensitive dry film 98) is strong. Accordingly, the penetration of ink 110 from the boundary surfaces thereof is prevented even more. Further, because the resin protective film 88 and the partitioning wall 42 are formed of the same type of resin material in this way, the coefficients of thermal expansion thereof are substantially equal, and therefore, there is also the advantage that little thermal stress arises.

Figure 9O:
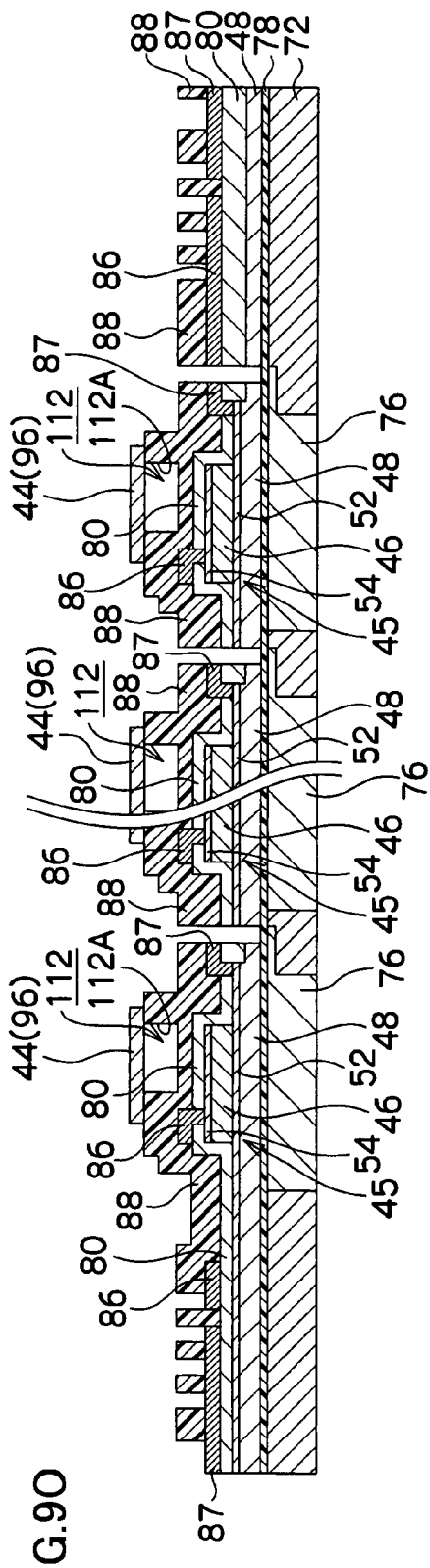

As shown in FIG. 9O, at the peripheral walls of the concave portions 112A, the photosensitive dry film 96 (e.g., Raytec FR-5025 manufactured by Hitachi Chemical Co., Ltd., thickness: 25 µm) is patterned (bridged) by exposure and development so as to face the respective piezoelectric elements 45 which are arranged in the form of a matrix. This photosensitive dry film 96 becomes the air damper 44 which mitigates pressure waves.

Figure 9P:
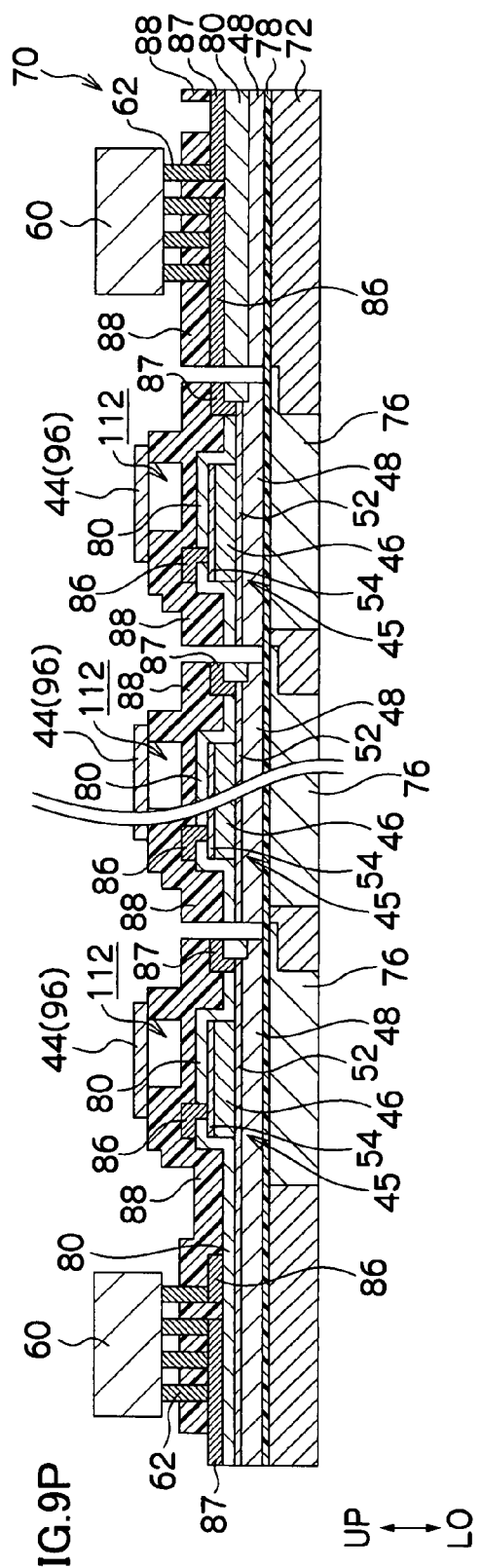

Next, as shown in FIG. 9P, the bumps 62 are formed at places where the resin protective film 88 is not layered and at which the metal wires 86, 87 are exposed, and the driving ICs 60 are flip-chip mounted via the bumps 62. At this time, the driving ICs 60 are machined to a predetermined thickness (70 µm to 300 µm) in a grinding process which is carried out in advance at the end of the semiconductor wafer process. If the driving ICs 60 are too thick, patterning of the partitioning wall 42 shown in FIG. 5 and formation of the bumps 64 become difficult. Electroplating, electroless plating, ball bumps, screen printing, and the like can be used as the method of forming the bumps 62 for flip-chip mounting the driving ICs 60 on the metal wires 86, 87. In this way, the piezoelectric element substrate 70 is fabricated.

Then, as shown in FIG. 10A, the bumps 64 are formed by plating or the like at places where the resin protective film 88 is not layered and the metal wires 87 are exposed. In order to electrically connect these bumps 64 to the metal wires 90 (see FIG. 5) provided at the ceiling plate 40, the heights of the bumps 64 are formed to be higher than that of the photosensitive dry film 98 (the partitioning wall 42) shown in FIG. 10B.

Subsequently, as shown in FIG. 10B, the photosensitive dry film 98 (thickness: 100 µm) is layered on predetermined positions of the resin protective film 88, and is patterned by exposure and development. This photosensitive dry film 98 becomes the partitioning wall 42 which prescribes the ink pooling chamber 38 (see FIG. 5). Note that the partitioning wall 42 is not limited to the photosensitive dry film 98, and may be a resin coated film (e.g., SU-8 resist manufactured by Kayaku MicroChem Corporation). At this time, it suffices for coating to be carried out by a spray coating device, and for exposure and development to be carried out.

Figure 10C:
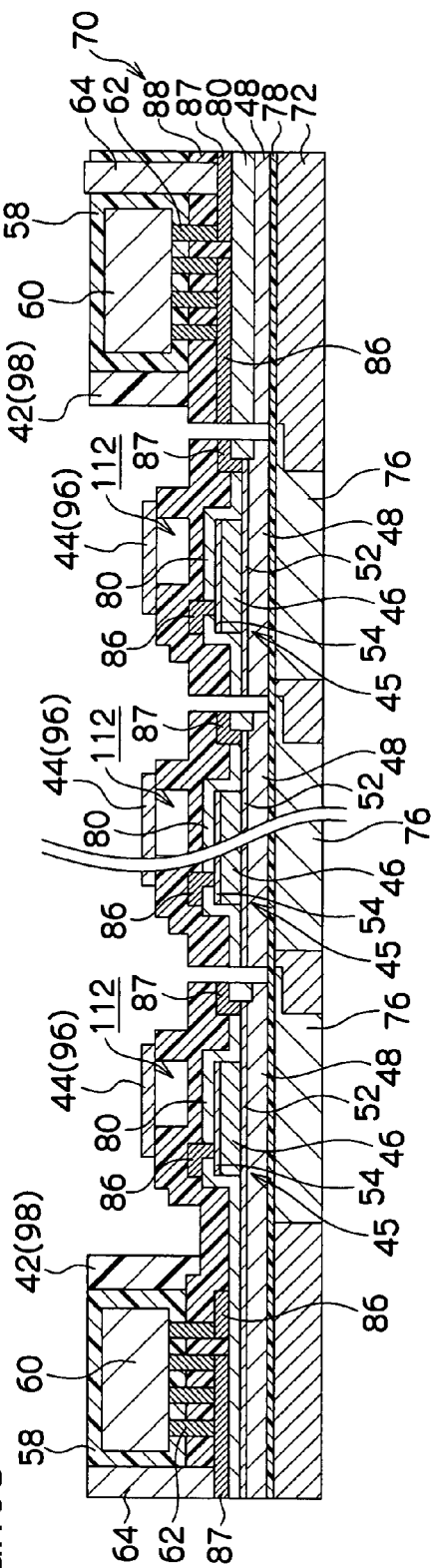

After the partitioning wall 42 and the bumps 64 are formed, as shown in FIG. 10C, the resin material 58 for sealing (e.g., an epoxy resin) is injected-in around the driving ICs 60. When the resin material 58 is injected-in and the driving ICs 60 are sealed in this way, the driving ICs 60 can be protected from the external environment such as moisture and the like, and the bonding strength of the piezoelectric element substrate 70 and the ceiling plate 40 can be improved. Further, it is possible to avoid damage in the later steps, e.g., damage due to water or ground pieces at the time when the finished piezoelectric element substrate 70 is divided into the inkjet recording heads 32 by dicing.

Figure 10D:
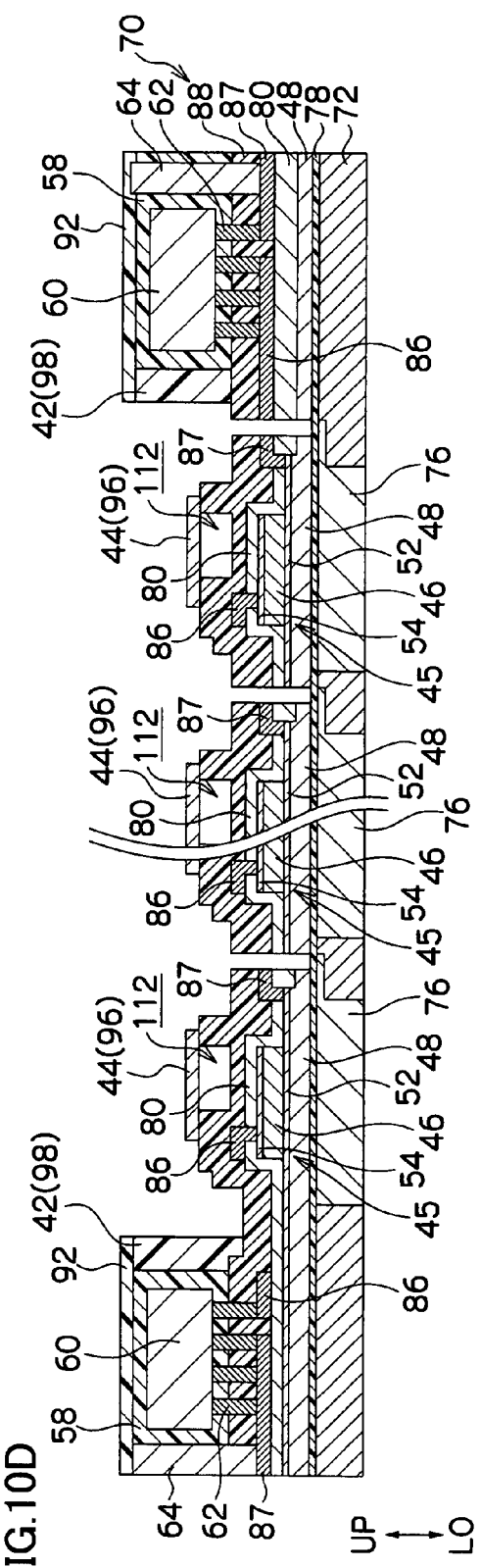

Then, as shown in FIG. 10D, the resin film 92 (e.g., photosensitive polyimide Durimide 7320 manufactured by FUJIFILM Electronics Materials Co., Ltd.) is layered on the partitioning wall 42, the bumps 64, and the resin material 58 for sealing, and is patterned. Next, as shown in FIG. 10E, the surface of the resin film 92 is etched such that concave portions 92A are formed, and, as shown in FIG. 10F, the metal wires 90 are layered in the concave portions 92A and are patterned. Specifically, this is deposition of an Al film (thickness: 1 µm) by sputtering, resist formation by photolithography, etching of the Al film by RIE using a chlorine gas, and removal of the resist film by oxygen plasma.

Figure 10G:
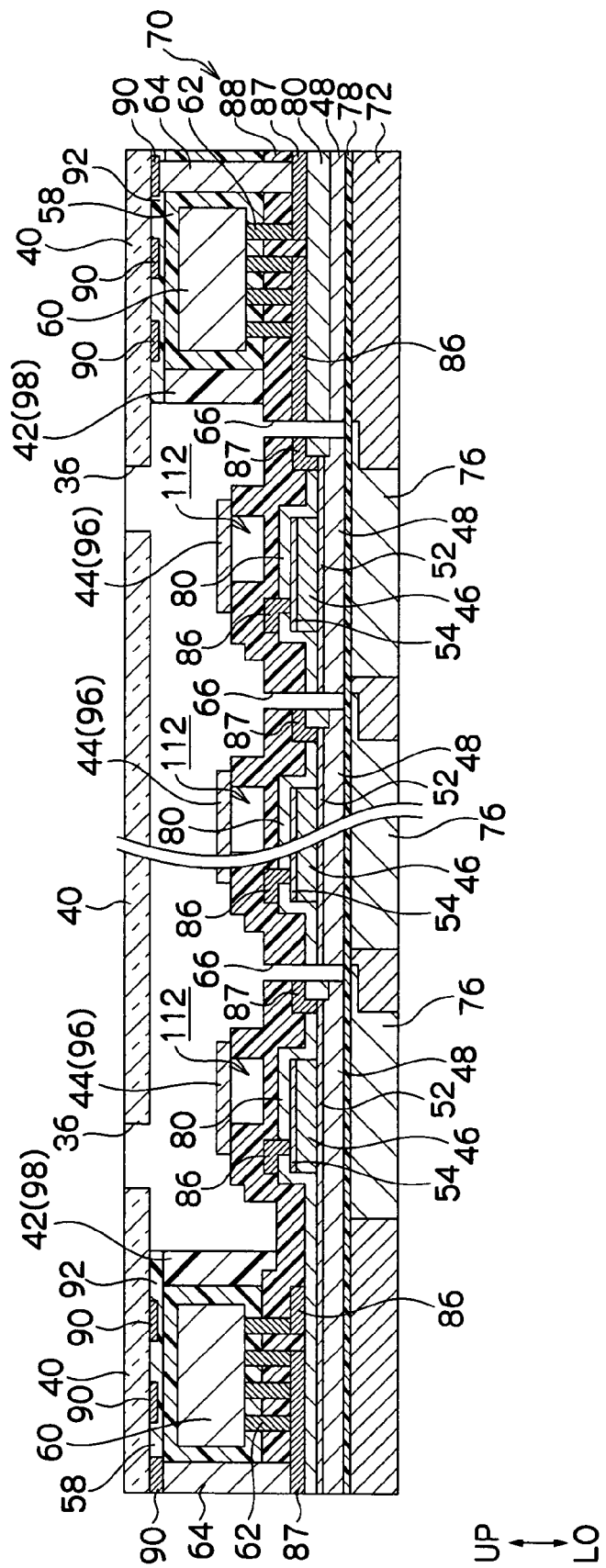
FIG. 10G is an explanatory drawing showing a process of joining the ceiling plate to the piezoelectric element substrate.

Next, as shown in FIG. 10G, the ceiling plate 40, whose support is a glass plate, is joined (united) to the resin film 92 and the metal wires 90 by thermocompression bonding (e.g., 20 minutes at 350° C. and 2 kg/cm$^2$). Note that the ink supply ports 36, which are connected to the ink tank (not shown), are formed in advance in the ceiling plate 40 at predetermined places. Specifically, a resist of a photosensitive dry film is patterned by photolithography, sandblasting processing is carried out by using this resist as a mask such that openings are formed, and thereafter, the resist is removed by oxygen plasma.

Figure 11A:
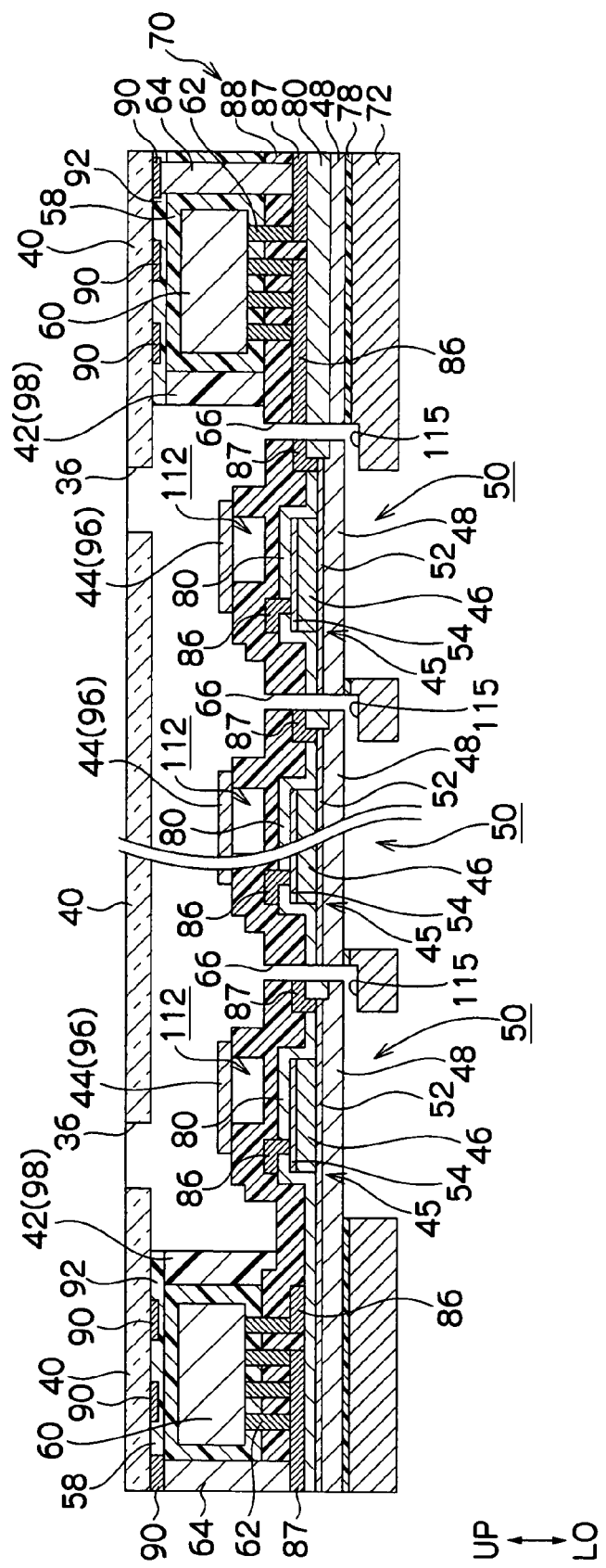
FIG. 11A is an explanatory drawing showing a process of forming pressure chambers at the silicon substrate of the inkjet recording head relating to the exemplary embodiments of the present invention.

Then, as shown in FIG. 11A, the glass paste 76 which is filled (buried) in the silicon substrate 72 is selectively removed by etching by a dissolving solution containing HF. Because the vibrating plates 48 are protected from the HF solution by the Ge film 78 at this time, the vibrating plates 48 are not etched. Namely, as described above, the Ge film 78 functions as an etching stopper layer which, at the time when the glass paste 76 is removed by etching by the HF solution, prevents the vibrating plates 48 from being removed by etching together therewith.

Note that, although a liquid containing HF is used in the removal of the glass paste 76 here, a gas or vapor containing HF may be used in the removal of the glass paste 76. If the etching liquid is supplied from a narrow entrance, there are cases in which the progress of the etching is impeded because the bubbles arising at the time of etching the material to be etched (the glass paste 76 in this case) cannot be removed, and replacement with new etching liquid is not possible. When gas or vapor is used, such a problem does not arise. Therefore, in a case such as described above, it is preferable to use a gas or vapor.

A dissolving solution of the Ge film 78, e.g., hydrogen peroxide ($H_2O_2$) which is heated to 60° C. for example, is supplied from the pressure chamber 50 side, and portions of the Ge film 78 are removed by etching. At this stage, the pressure chambers 50 and the communication paths 115 are completed. When the Ge film 78 is removed by etching, there is no particular problem in the Ge film 78 remaining as is at regions other than where the pressure chambers 50 and the communication paths 115 are formed.

Figure 11B:
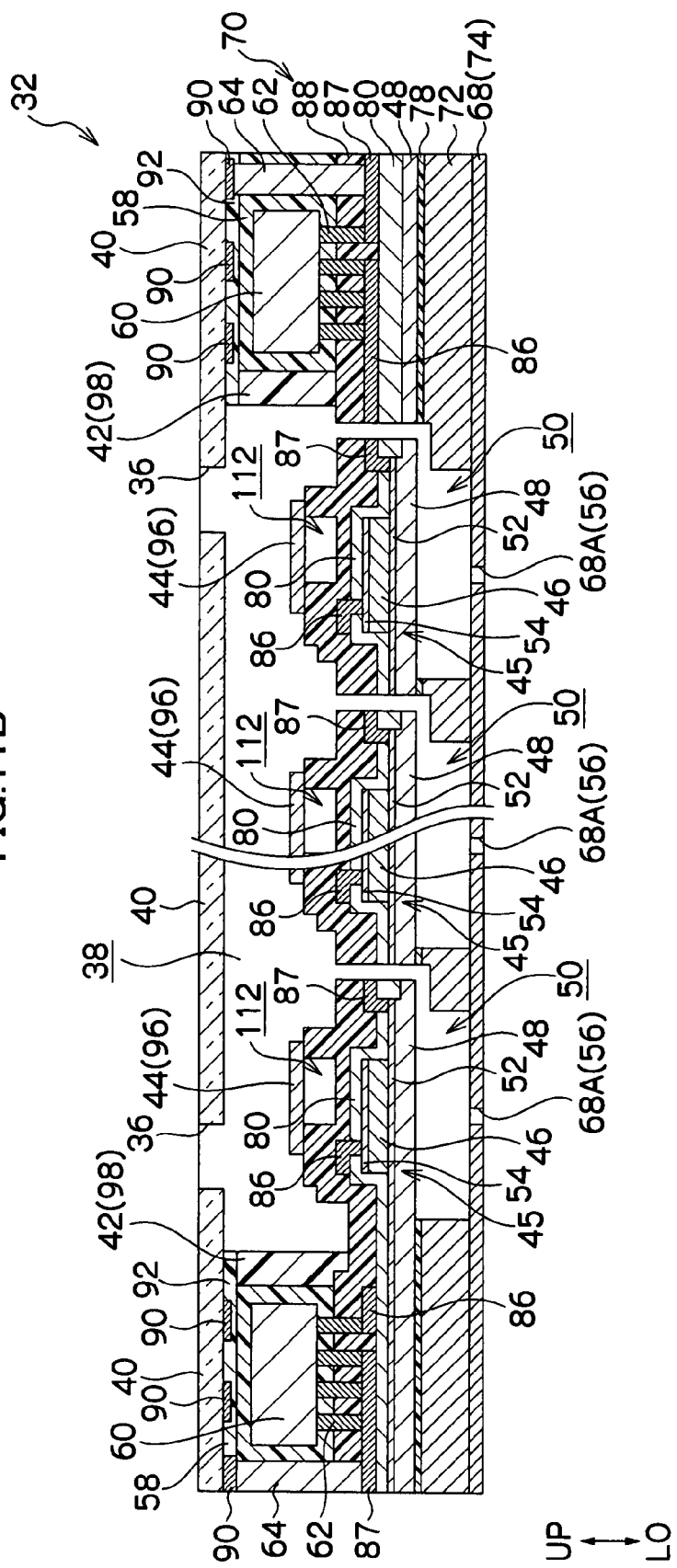
FIG. 11B is an explanatory drawing showing a process of joining a nozzle plate to the silicon substrate.

Next, as shown in FIG. 11B, the nozzle plate 74 is affixed to the bottom surface of the silicon substrate 72. Namely, the nozzle film 68, in which are formed openings 68A which become the nozzles 56, is affixed to the bottom surface of the silicon substrate 72.

In this way, the inkjet recording head 32 is completed, and, as shown in FIG. 5, the ink 110 can be filled into the ink pooling chamber 38 and the pressure chambers 50. Note that this manufacturing method is an example, and, when possible, the order of the respective processes may be reversed.

For example, in the present exemplary embodiment, after the ceiling plate 40 is joined (united) to the resin film 92 and the metal wires 90 as shown in FIG. 10G, the glass paste 76 of the silicon substrate 72 is removed in FIG. 11A. However, the glass paste 76 may be removed before the joining of the ceiling plate 40.

Further, in the present exemplary embodiment, the silicon substrate 72 is opened by RIE, the glass paste 76 is embedded-in, and thereafter, the steps thereafter are carried out. However, fabrication is also possible by a method in which function portions are first formed around the piezoelectric elements 45, and thereafter, the silicon substrate 72 is opened from the reverse surface and the pressure chambers 50 are formed.

Operation of the inkjet recording device 10, which is equipped with the inkjet recording head 32 which is manufactured in this way, will be described next.

First, when an electric signal instructing printing is sent to the inkjet recording device 10 shown in FIG. 1, one of the recording sheets P is picked-up from the stocker 24, and is conveyed by the conveying device 26.

On the other hand, at the inkjet recording unit 30, the ink 110 has already been injected-in (filled-in) in the ink pooling chamber 38 of the inkjet recording head 32 shown in FIG. 5 from the ink tank and via the ink supply ports. The ink 110 which is filled in the ink pooling chamber 38 is supplied to (filled into) the pressure chambers 50 via the ink flow path 66. At this time, a meniscus, in which the surface of the ink 110 is slightly concave toward the pressure chamber 50 side, is formed at the distal end (the ejecting opening) of the nozzle 56.

Then, while the recording sheet P is being conveyed, due to ink droplets being selectively ejected from the plural nozzles 56, a portion of the image based on the image data is recorded on the recording sheet P. Namely, voltage is applied to predetermined piezoelectric elements 45 at predetermined times by the driving ICs 60, the vibrating plates 48 are flexurally deformed in the vertical direction (are out-of-plane vibrated), pressure is applied to the ink 110 within the pressure chambers 50, and the ink 110 is ejected as ink droplets from predetermined nozzles 56. When the image based on the image data has been completely recorded on the recording sheet P, the recording sheet P is discharged-out to the tray 25 by the sheet discharging belt 23. In this way, the printing processing (image recording) onto the recording sheet P is completed.

Here, the inkjet recording head 32 is structured such that the ink pooling chamber 38 is provided at the opposite side (the upper side) of the pressure chambers 50, with the vibrating plates 48 (the piezoelectric elements 45) therebetween. In other words, the vibrating plates 48 (the piezoelectric elements 45) are disposed between the ink pooling chamber 38 and the pressure chambers 50, and the ink pooling chamber 38 and the pressure chambers 50 do not exist on the same horizontal plane.

By making the ink pooling chamber 38 and the pressure chambers 50 not exist on the same horizontal plane in this way, the pressure chambers 50 can be disposed close to one another. Therefore, the nozzles 56 provided at the respective pressure chambers 50 can be arranged at a high density.

By providing isolating chambers 112 within the ink pooling chamber 38 and isolating the piezoelectric elements 45 from the ink 110 by the isolating chambers 112, constraining force due to the ink 110 is not borne at the piezoelectric elements 45. Therefore, the flexural deformation of the piezoelectric elements 45 is not impeded by such constraining force. Further, by isolating the piezoelectric elements 45 from the ink 110 by the isolating chambers 112, the piezoelectric elements 45 can be protected from erosion due to the ink.

On the other hand, when the pressure chamber 50 is pressurized due to the flexural deformation of the piezoelectric element 45 and the ink 110 is ejected as an ink droplet from the nozzle 56 connected to the pressure chamber 50, the pressure wave of the ink 110, which is transferred to the interior of the ink pooling chamber 38 via the ink flow path 66, is mitigated by the air damper 44 provided at the isolating chamber 112.

In the present exemplary embodiment, in a case in which the piezoelectric elements 45 are formed on the vibrating plate 48, as shown in FIGS. 9G and 9H, the layered film (lower electrode layer) 63 of Ir and Ti is film-formed on the top surface of the vibrating plate 48 by sputtering, and thereafter, the PZT film (piezoelectric body layer) 65 and the Ir film (upper electrode layer) 67 are layered (film-formed) by sputtering in that order on the top surface of the layered film 63. It can be understood that the polarization direction of the piezoelectric body 46 due thereto is from the lower electrode 52 toward the upper electrode 54.

Figure 12:
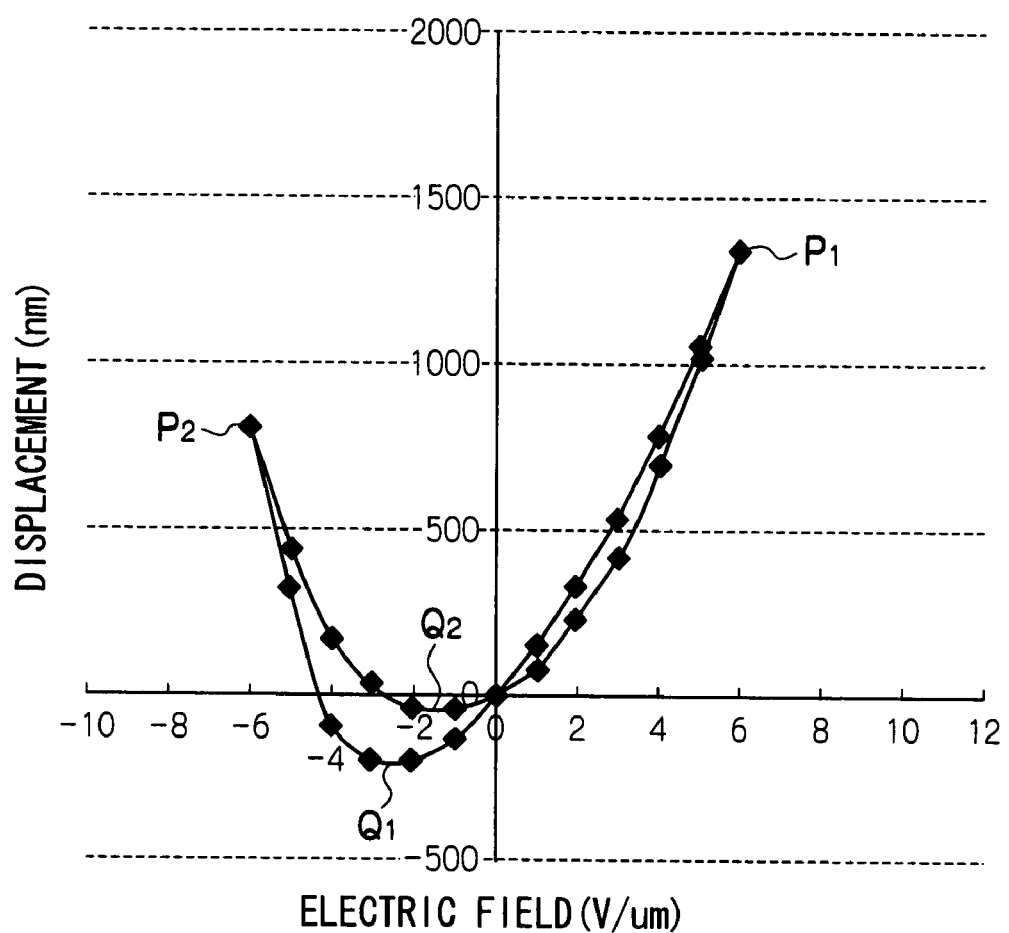
FIG. 12 is a graph showing an amount of displacement of a piezoelectric body with respect to the orientation of polarization of the piezoelectric body which structures a piezoelectric element of the inkjet recording head relating to the exemplary embodiments of the present invention.

FIG. 12 shows the amounts of displacement (actually measured values) of the piezoelectric body 46 with respect to the orientation of polarization of the piezoelectric body 46. The potential of the lower electrode 52 is shown on the horizontal axis, and the amount of displacement of the piezoelectric body 46 is shown on the vertical axis. When the lower electrode 52 is made to be positive potential and the voltage of the lower electrode 52 is raised, the extension of the piezoelectric body 46 increases, and when a saturation polarization $P_1$ is reached, the piezoelectric body 46 gradually contracts.

In contrast, when the lower electrode 52 is made to be negative potential and the voltage of the lower electrode 52 is lowered, the piezoelectric body 46 further contracts, and when coercive electric field $Q_1$ is reached, the polarization direction of the piezoelectric body 46 is reversed. Thereafter, as the voltage of the lower electrode 52 falls, the piezoelectric body 46 gradually extends, and when saturation polarization $P_2$ is reached, the piezoelectric body 46 gradually contracts. Then, when coercive electric field $Q_2$ is reached, the polarization direction of the piezoelectric body 46 is reversed.

Namely, in a case in which the lower electrode 52 is made to be positive potential, the polarization direction of the piezoelectric body 46 is the direction from the lower electrode 52 toward the upper electrode 54 (the direction of arrow P in FIG. 14), and is so-called non-reverse polarization. In a case in which the lower electrode 52 is made to be negative potential, the polarization direction of the piezoelectric body 46 is the direction from the upper electrode 54 toward the lower electrode 52 (the direction opposite arrow P in FIG. 14), and is so-called reverse polarization.

From this graph, it can be understood that, in cases in which the lower electrode 52 is made to be positive potential and in cases in which it is made to be negative potential, the amount of displacement of the piezoelectric element 45 is higher when the lower electrode 52 is made to be positive potential.

Figure 13:
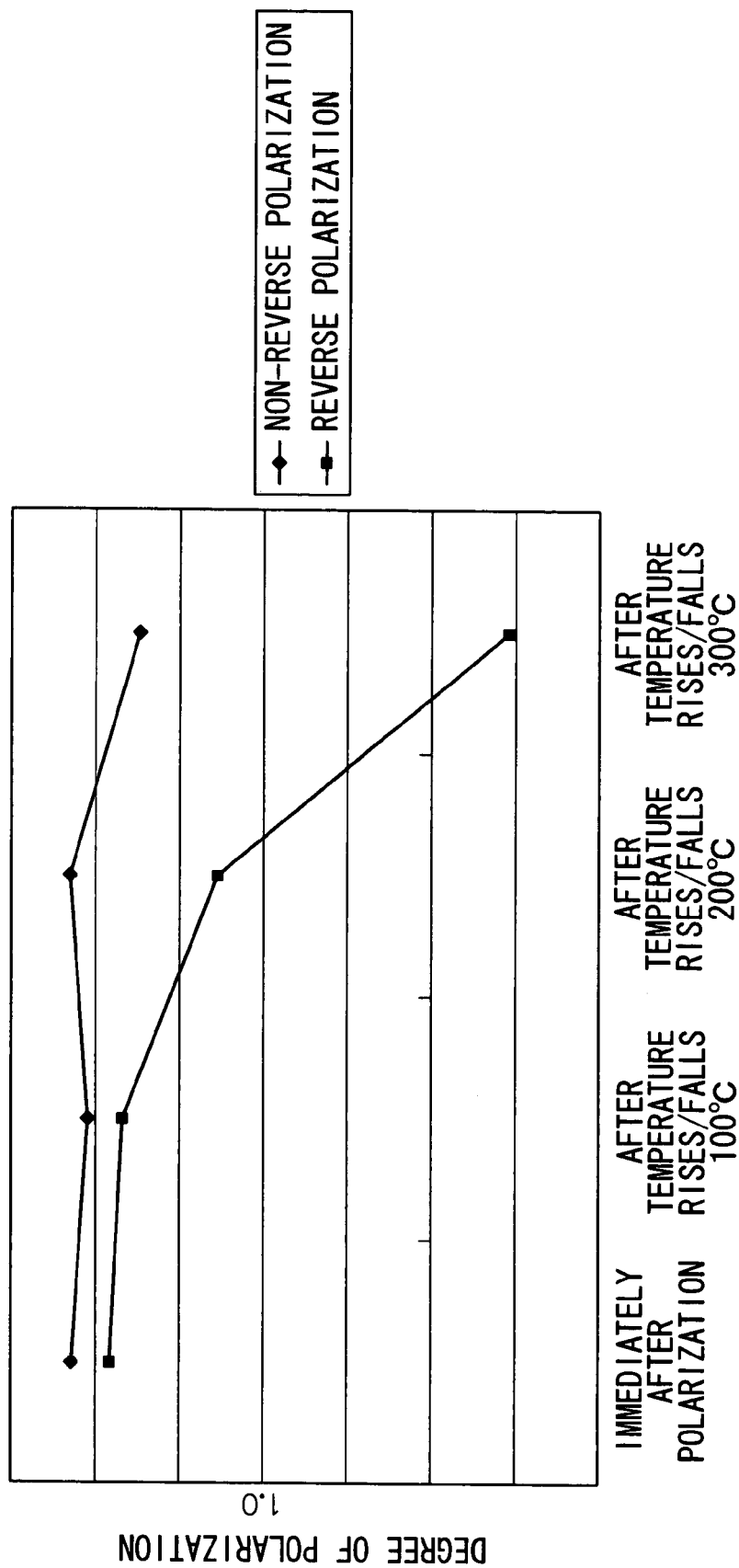
FIG. 13 is a graph showing temperature stability of the degree of polarization in accordance with differences in the polarization direction of the piezoelectric body.

FIG. 13 is a graph showing the temperature stability of the degree of polarization (the degree of polarization when the value before polarization is 1) in accordance with differences in the polarization direction of the piezoelectric body 46. From this graph, it can be understood that more stability with respect to temperature changes can be obtained in a case in which the polarization direction of the piezoelectric body 46 is directed from the lower electrode 52 toward the upper electrode 54 (non-reverse polarization: the direction of arrow P in FIG. 14), as compared with a case in which it is directed from the upper electrode 54 toward the lower electrode 52 (reverse polarization: the direction opposite arrow P in FIG. 14).

Namely, the fact that the displacement characteristic of the piezoelectric body 46 and the stability in accordance with the temperature changes differ in accordance with the orientation of the polarization direction of the piezoelectric body 46 was derived empirically.

Figure 14:
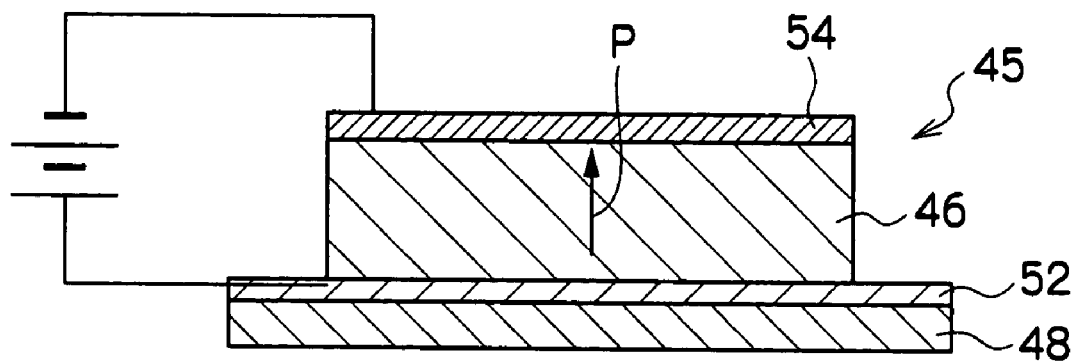
FIG. 14 is an explanatory drawing showing a wiring diagram of an upper electrode and a lower electrode of the piezoelectric element of the inkjet recording head relating to the exemplary embodiments of the present invention.

Therefore, in the present exemplary embodiment, by prescribing this polarization direction, the piezoelectric element 45 is utilized efficiently, and the polarization does not depolarize even under the temperatures in the processes. Accordingly, as shown in FIG. 14, the upper electrode 54 is made to be ground potential (GND), and a positive voltage is applied to the lower electrode 52.

Figure 15A:
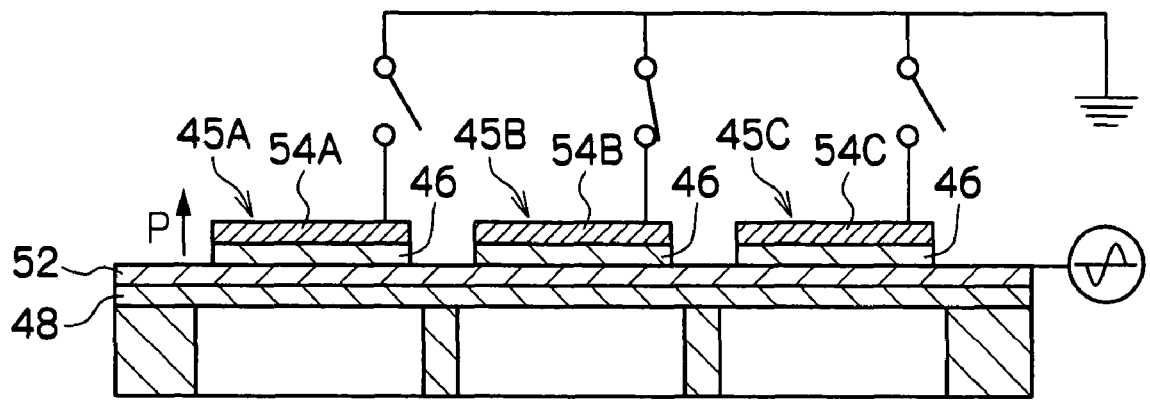
FIG. 15A is a first exemplary embodiment of the piezoelectric elements of the inkjet recording head relating to the exemplary embodiments of the present invention.
Figure 15B:
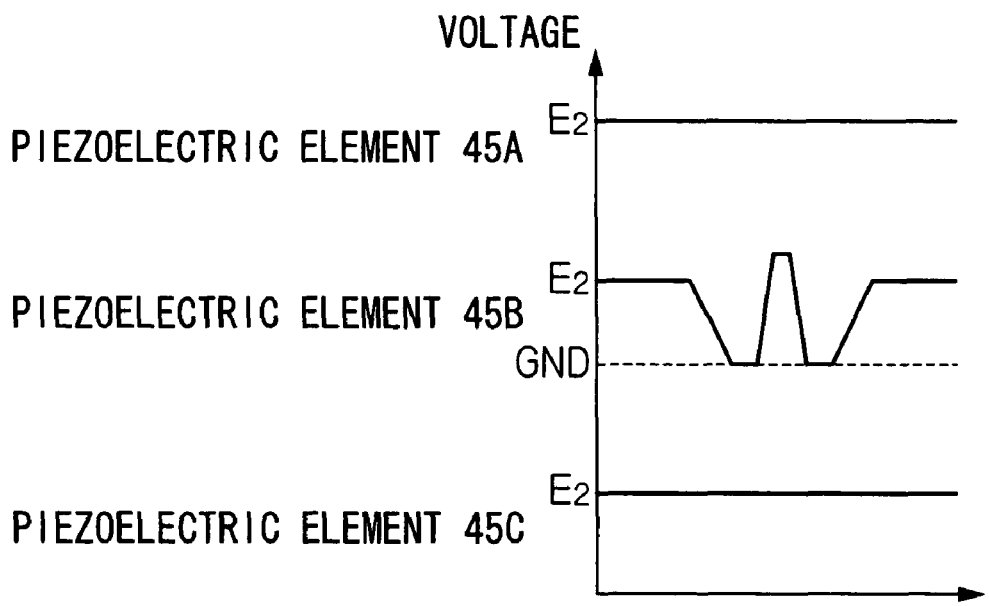
FIG. 15B is a diagram showing examples of driving waveforms of the piezoelectric elements.

For example, FIGS. 15A and 15B are a first exemplary embodiment, and are diagrams showing examples of driving waveforms of the piezoelectric elements 45. Here, upper electrodes 54A, 54B, 54C of piezoelectric elements 45A, 45B, 45C are individual electrodes, and the respective upper electrodes 54A, 54B, 54C can be connected to GND. The lower electrode 52 is made to be a common electrode, and driving waveforms are applied.

In the state shown in FIG. 15A, the wires for connecting the upper electrodes 54A, 54C to GND are not connected, and the piezoelectric elements 45A, 45C are in non-driven states even if positive voltage is applied to the lower electrode 52 (see FIG. 15B). On the other hand, because the upper electrode 54B of the piezoelectric element 45B is connected to GND, when positive voltage is applied to the lower electrode 52, the piezoelectric element 45B flexurally deforms and ink is ejected (see FIG. 15B) from the nozzle 56 (see FIG. 4).

Figure 16A:
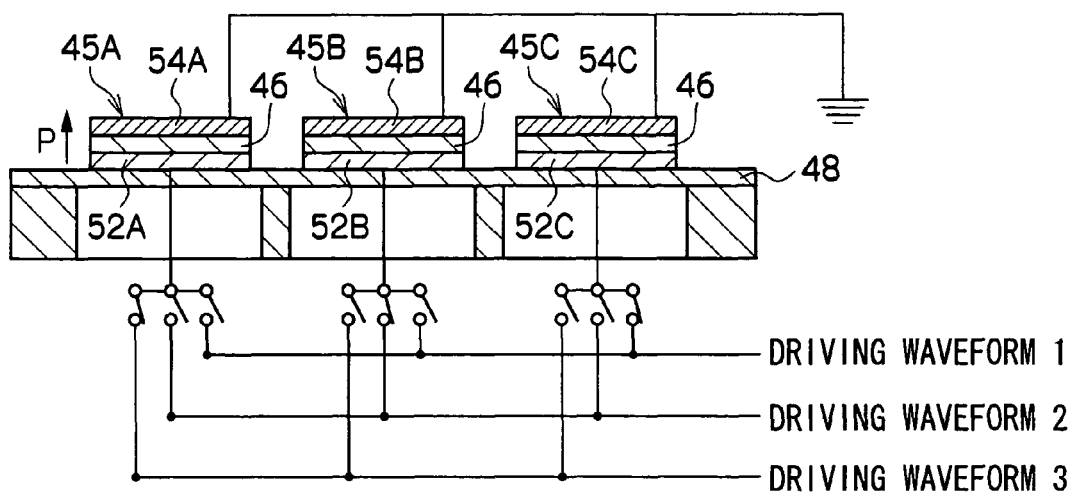
FIG. 16A is a second exemplary embodiment of the piezoelectric elements of the inkjet recording head relating to the exemplary embodiments of the present invention.
Figure 16B:
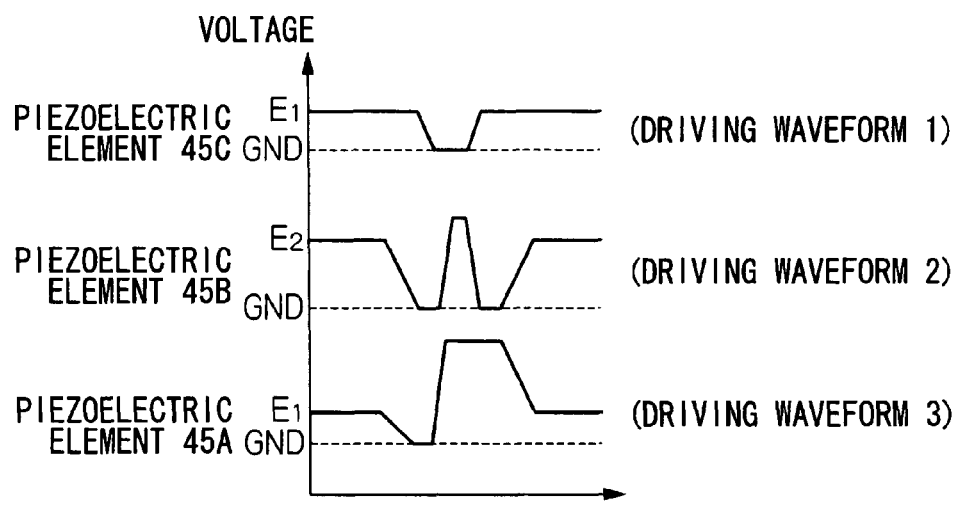
FIG. 16B is a diagram showing examples of driving waveforms of the piezoelectric elements.

FIGS. 16A and 16B are a second exemplary embodiment, and are diagrams showing examples of driving waveforms of the piezoelectric elements 45. The upper electrodes 54A, 54B, 54C of the piezoelectric elements 45A, 45B, 45C are common electrodes, and are respectively connected to GND. Lower electrodes 52A, 52B, 52C are individuated as individual electrodes, and driving waveform selecting circuits are respectively structured thereat. In this way, different driving waveforms can simultaneously be applied to the respective piezoelectric elements 45A, 45B, 45C.

As an example, as shown in FIG. 16A, a waveform which slightly vibrates the meniscus is applied by driving waveform 1, a small droplet ejecting waveform is applied by driving waveform 2, and a large droplet ejecting waveform is applied by driving waveform 3. Further, as shown in FIGS. 16A and 16B, because the driving waveform 3 is connected to the lower electrode 52A of the piezoelectric element 45A, when positive voltage is applied to the lower electrode 52A, a large droplet of ink is ejected from the nozzle 56 due to the flexural deformation of the piezoelectric element 45A.

Because the driving waveform 2 is connected to the lower electrode 52B of the piezoelectric element 45B, when positive voltage is applied to the lower electrode 52B, a small droplet of ink is ejected from the nozzle 56 due to the flexural deformation of the piezoelectric element 45B. Further, because the driving waveform 1 is connected to the lower electrode 52C of the piezoelectric element 45C, when positive voltage is applied to the lower electrode 52C, slight vibration of the meniscus, to the extent that a liquid droplet is not ejected from the nozzle 56, is formed due to the flexural deformation of the piezoelectric element 45C.

Namely, the amount of ink which is ejected from the nozzles 56 of the respective piezoelectric elements 45A, 45B, 45C can be varied in accordance with which driving waveform is connected to each of the lower electrodes 52A, 52B, 52C.

Note that, here, the upper electrode 54 is connected to GND, and positive voltage is applied to the lower electrode 52. However, because it suffices for the polarization direction of the piezoelectric body 46 to be the direction from the lower electrode 52 toward the upper electrode 54 (the direction of arrow P in FIG. 14), it suffices for the voltage of the lower electrode 52 to be higher than or equal to the voltage of the upper electrode 54. For example, it suffices to connect the lower electrode 52 to GND and apply negative voltage to the upper electrode 54.

In the inkjet recording device 10 of the above-described exemplary embodiment, ink droplets are selectively ejected, on the basis of image data, from the inkjet recording units 30 of the respective colors of black, yellow, magenta, and cyan, such that a full-color image is recorded on the recording sheet P. However, the inkjet recording in the present invention is not limited to the recording of characters and images onto the recording sheet P.

Namely, the recording medium is not limited to paper, and the liquid which is ejected is not limited to ink. For example, the inkjet recording head 32 relating to the present invention can be applied to liquid droplet jetting devices in general which are used industrially, such as in fabricating color filters for displays by ejecting ink onto a high polymer film or glass, or in forming bumps for parts mounting by ejecting solder in a welded state onto a substrate, or the like.

Further, in the inkjet recording device 10 of the above-described exemplary embodiment, the example of a so-called Full Width Array (FWA), which corresponds to the width of a sheet, is described. However, the present invention is not limited to the same, and a Partial Width Array (PWA) which has a fast scanning mechanism and a slow scanning mechanism may be utilized.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A piezoelectric element comprising:
    a lower electrode that is formed on a surface of a vibrating plate, and is one polarity of the piezoelectric element that displaces the vibrating plate;
    a flexurally-deformable piezoelectric body that is formed on a surface of the lower electrode by a vacuum deposition method; and
    an upper electrode that is formed on a surface of the piezoelectric body, and is another polarity of the piezoelectric element,
    polarization of the piezoelectric body being oriented in a direction from the lower electrode toward the upper electrode, and a voltage that is greater than or equal to a voltage applied to the upper electrode, is applied to the lower electrode when driving the piezoelectric element.

2. The piezoelectric element of claim 1, wherein the lower electrode is an individual electrode, and the upper electrode is a common electrode.

3. The piezoelectric element of claim 2, wherein the lower electrode comprises a plurality of individual lower electrodes and different driving waveforms can be applied to different individual lower electrodes.

4. The piezoelectric element of claim 2, wherein,
    the lower electrode comprises a plurality of individual lower electrodes; and a waveform which slightly vibrates the meniscus is applied to a first individual lower electrode, a small droplet ejecting waveform is applied to a second individual lower electrode, and a large droplet ejecting waveform is applied to a third individual lower electrode.

5. The piezoelectric element of claim 1, wherein the upper electrode is set to ground potential and a positive voltage is applied to the lower electrode.

6. A liquid droplet ejecting head comprising:
a vibrating plate;
a piezoelectric element including: a lower electrode that is formed on a surface of the vibrating plate, and is one polarity of the piezoelectric element that displaces the vibrating plate; a flexurally-deformable piezoelectric body formed on a surface of the lower electrode by a vacuum deposition method; and an upper electrode that is formed on a surface of the piezoelectric body, and is another polarity of the piezoelectric element, polarization of the piezoelectric body being oriented in a direction from the lower electrode toward the upper electrode, and a voltage that is greater than or equal to a voltage applied to the upper electrode, is applied to the lower electrode when driving the piezoelectric element;
a pressure chamber plate that forms a pressure chamber having a volume that can be varied by the vibrating plate at which the piezoelectric element is provided;
a liquid pooling chamber that supplies liquid to the pressure chamber; and
a nozzle plate that ejects a liquid droplet that is pressurized at the pressure chamber.

7. The liquid droplet ejecting head of claim 6, wherein the vibrating plate is disposed between the liquid pooling chamber and the pressure chamber.

8. The liquid droplet ejecting head of claim 3, wherein the liquid pooling chamber and the pressure chamber are disposed so as to not exist on the same horizontal plane.

9. The liquid droplet ejecting head of claim 6, wherein the liquid pooling chamber is provided at an upper electrode side of the piezoelectric element, and an isolating chamber that forms a gap is disposed between the liquid pooling chamber and the upper electrode.

10. The liquid droplet ejecting head of claim 9, wherein a portion of an outer wall that demarcates the isolating chamber includes an air damper.

11. A liquid droplet ejecting head comprising:
a vibrating plate;
a piezoelectric element having a first electrode of the piezoelectric element that is formed on a surface of the vibrating plate, a flexurally-deformable piezoelectric body layer that is formed at a surface of the first electrode, and a second electrode of the piezoelectric element that is formed at a surface of the piezoelectric body layer at an opposite side to the first electrode, polarization of the piezoelectric body layer being oriented in a direction from the first electrode toward the second electrode, and a voltage that is greater than or equal to a voltage applied to the second electrode, is applied to the first electrode when driving the piezoelectric element;
a pressure chamber plate that forms a pressure chamber having a volume that is varied by the vibrating plate at which the piezoelectric element is provided;
a liquid pooling chamber that supplies liquid to the pressure chamber; and
a nozzle plate that ejects a liquid droplet that is pressurized at the pressure chamber.

12. The liquid droplet ejecting head of claim 11, wherein the piezoelectric body layer is formed on the surface of the first electrode by a vacuum deposition method.

13. The liquid droplet ejecting head of claim 11, wherein the first electrode is an individual electrode, and the second electrode is a common electrode.

14. The liquid droplet ejecting head of claim 13, wherein the first electrode comprises a plurality of individual first electrodes and different driving waveforms can be applied to different individual first electrodes.

15. The liquid droplet ejecting head of claim 13, wherein, the first electrode comprises a plurality of individual first electrodes; and
a waveform which slightly vibrates the meniscus is applied to a first individual first electrode, a small droplet ejecting waveform is applied to a second individual first electrode, and a large droplet ejecting waveform is applied to a third individual first electrode.

16. The liquid droplet ejecting head of claim 11, wherein the vibrating plate is disposed between the liquid pooling chamber and the pressure chamber.

17. The liquid droplet ejecting head of claim 11, wherein the liquid pooling chamber and the pressure chamber are disposed so as to not exist on the same horizontal plane.

18. The liquid droplet ejecting head of claim 11, wherein the liquid pooling chamber is provided at a first electrode side of the piezoelectric element, and an isolating chamber that forms a gap is disposed between the liquid pooling chamber and the second electrode.

19. The liquid droplet ejecting head of claim 18, wherein a portion of an outer wall that demarcates the isolating chamber includes an air damper.

20. The liquid droplet ejecting head of claim 11, wherein the second electrode of the piezoelectric element is set to ground potential and a positive voltage is applied to the first electrode of the piezoelectric element.

21. An image forming device comprising:
a liquid droplet ejecting head, the liquid droplet ejecting head including:
a vibrating plate,
a piezoelectric element including: a lower electrode that is formed on a surface of the vibrating plate, and is one polarity of the piezoelectric element that displaces the vibrating plate; a flexurally-deformable piezoelectric body that is formed on a surface of the lower electrode by a vacuum deposition method; and an upper electrode that is formed on a surface of the piezoelectric body, and is another polarity of the piezoelectric element, polarization of the piezoelectric body being oriented in a direction from the lower electrode toward the upper electrode,
a pressure chamber plate that forms a pressure chamber having a volume that can be varied by the vibrating plate at which the piezoelectric element is provided,
a liquid pooling chamber that supplies liquid to the pressure chamber, and
a nozzle plate that ejects a liquid droplet that is pressurized at the pressure chamber; and
a driving circuit that applies a voltage that is greater than or equal to a voltage applied to the upper electrode, to the lower electrode when driving the piezoelectric element, and drives the liquid droplet ejecting head.

* * * * *